(12) United States Patent
Hara et al.

(10) Patent No.: US 11,616,305 B2
(45) Date of Patent: Mar. 28, 2023

(54) SCANNING ANTENNA AND METHOD FOR MANUFACTURING SCANNING ANTENNA

(71) Applicants: Sharp Kabushiki Kaisha, Sakai (JP); KYMETA CORPORATION, Redmond, WA (US)

(72) Inventors: Takeshi Hara, Sakai (JP); Susumu Nakano, Yonago (JP); Koji Yasuda, Yonago (JP); Yoji Taniguchi, Yonago (JP); Yoshinori Tanaka, Yonago (JP); Ryan A. Stevenson, Redmond, WA (US); Steve Linn, Redmond, WA (US); Cagdas Varel, Redmond, WA (US); Colin Short, Redmond, WA (US); Felix Chen, Redmond, WA (US)

(73) Assignees: SHARP KABUSHIKI KAISHA, Sakai (JP); KYMETA CORPORATION, Redmond, WA (US)

( * ) Notice: Subject to any disclaimer, the term of this patent is extended or adjusted under 35 U.S.C. 154(b) by 133 days.

(21) Appl. No.: 17/312,090

(22) PCT Filed: Dec. 2, 2019

(86) PCT No.: PCT/JP2019/047073
§ 371 (c)(1),
(2) Date: Jun. 9, 2021

(87) PCT Pub. No.: WO2020/121877
PCT Pub. Date: Jun. 18, 2020

(65) Prior Publication Data
US 2022/0029300 A1    Jan. 27, 2022

(30) Foreign Application Priority Data

Dec. 12, 2018 (JP) .............................. JP2018-232636

(51) Int. Cl.
*H01Q 1/22* (2006.01)
*H01Q 13/22* (2006.01)
(Continued)

(52) U.S. Cl.
CPC ........... *H01Q 13/22* (2013.01); *G02F 1/1339* (2013.01); *H01Q 1/2283* (2013.01); *H01Q 3/34* (2013.01); *H01Q 21/0087* (2013.01)

(58) Field of Classification Search
CPC ............................ H01Q 13/22; H01Q 1/2283
(Continued)

(56) References Cited

U.S. PATENT DOCUMENTS 7,466,269 B2   12/2008  Haziza
7,847,894 B2   12/2010  Rho
(Continued)

FOREIGN PATENT DOCUMENTS

JP    2002-217640 A    8/2002
JP    2007-116573 A    5/2007
(Continued)

OTHER PUBLICATIONS

Stevenson et al., "Rethinking Wireless Communications: Advanced Antenna Design using LCD Technology", SID 2015 Digest, 55.2, 2015, pp. 827-830.
(Continued)

*Primary Examiner* — Peguy Jean Pierre
(74) *Attorney, Agent, or Firm* — Keating & Bennett, LLP

(57) ABSTRACT

A scanning antenna includes a transmission and/or reception region including a plurality of antenna units and a non-transmission and/or reception region other than the transmission and/or reception region. The scanning antenna includes a TFT substrate, a slot substrate, a liquid crystal layer, a seal portion surrounding the liquid crystal layer, a wall structure (additional seal portion) disposed in a region (Continued)

surrounded by the seal portion in the non-transmission and/or reception region, a reflective conductive plate, a first spacer structure defining a first gap between a first dielectric substrate and a second dielectric substrate in the transmission and/or reception region, and a second spacer structure disposed in the wall structure and defining a second gap wider than the first gap. The wall structure includes a first main side face and a second main side face that intersect a surface of the first dielectric substrate, and at least one of the first main side face and the second main side face includes a plurality of recessed portions and/or a plurality of protruding portions when viewed from a normal direction of the first dielectric substrate.

7 Claims, 25 Drawing Sheets

(51) Int. Cl.
  *G02F 1/1339* (2006.01)
  *H01Q 3/34* (2006.01)
  *H01Q 21/00* (2006.01)

(58) Field of Classification Search
  USPC .......................................................... 343/702
  See application file for complete search history.

(56) References Cited

U.S. PATENT DOCUMENTS

| | | | |
|---|---|---|---|
| 10,170,826 B2 | 1/2019 | Nakazawa et al. | |
| 11,462,644 B2 * | 10/2022 | Otsubo | G09G 3/3674 |
| 2002/0171798 A1 * | 11/2002 | Tanaka | G02F 1/136286 |
| | | | 349/153 |
| 2006/0038937 A1 * | 2/2006 | Kaneko | G02F 1/1365 |
| | | | 349/110 |

| | | |
|---|---|---|
| 2012/0092577 A1 | 4/2012 | Shi et al. |
| 2012/0138922 A1 | 6/2012 | Yamazaki et al. |
| 2012/0194399 A1 | 8/2012 | Bily et al. |
| 2013/0320334 A1 | 12/2013 | Yamazaki et al. |
| 2014/0286076 A1 | 9/2014 | Aoki et al. |
| 2018/0294542 A1 | 10/2018 | Minoura et al. |
| 2018/0337446 A1 | 11/2018 | Nakazawa et al. |

FOREIGN PATENT DOCUMENTS

| | | |
|---|---|---|
| JP | 2007-295044 A | 11/2007 |
| JP | 2009-538565 A | 11/2009 |
| JP | 2012-134475 A | 7/2012 |
| JP | 2013-539949 A | 10/2013 |
| JP | 2014-007399 A | 1/2014 |
| JP | 2014-209727 A | 11/2014 |
| WO | 2007/139736 A2 | 12/2007 |
| WO | 2012/050614 A1 | 4/2012 |
| WO | 2014/149341 A1 | 9/2014 |
| WO | 2015/126550 A1 | 8/2015 |
| WO | 2015/126578 A1 | 8/2015 |
| WO | 2016/057539 A1 | 4/2016 |
| WO | 2016/130383 A1 | 8/2016 |
| WO | 2016/141340 A1 | 9/2016 |
| WO | 2016/141342 A1 | 9/2016 |
| WO | 2017/061527 A1 | 4/2017 |
| WO | 2017/065088 A1 | 4/2017 |

OTHER PUBLICATIONS

Ando et al., "A Radial Line Slot Antenna for 12 GHz Satellite TV Reception", IEEE Transactions on Antennas and Propagation, vol. AP-33, No. 12, Dec. 1985, pp. 1347-1353.
Wittek et al., "Liquid Crystals for Smart Antennas and Other Microwave Applications", SID 2015 Digest, 55.1, 2015, pp. 824-826.
Kuki, "Novel RF Functional Devices Using Liquid Crystal", Polymer, vol. 55, Aug. 2006, pp. 599-602.

* cited by examiner

SCANNING ANTENNA AND METHOD FOR MANUFACTURING SCANNING ANTENNA

TECHNICAL FIELD

The disclosure relates to a scanning antenna, more particularly, to a scanning antenna having antenna units (also referred to as an "element antennas") with liquid crystal capacitance (also referred to as a "liquid crystal array antenna") and a manufacturing method of the scanning antenna.

BACKGROUND ART

Antennas for mobile communication and satellite broadcasting require functions that can change the beam direction (referred to as "beam scanning" or "beam steering"). As an example of an antenna (hereinafter referred to as a "scanning antenna" (scanned antenna) having such functionality, phased array antennas equipped with antenna units are known. However, known phased array antennas are expensive, which is an obstacle for popularization as a consumer product. In particular, as the number of antenna units increases, the cost rises considerably.

Therefore, scanning antennas that utilize the high dielectric anisotropy (birefringence index) of liquid crystal materials (including nematic liquid crystals and polymer dispersed liquid crystals) have been proposed (PTL 1 to PTL 5 and NPL 1). Since the dielectric constant of liquid crystal materials has a frequency dispersion, in the present specification, the dielectric constant in a frequency band for microwaves (also referred to as the "dielectric constant for microwaves") is particularly denoted as "dielectric constant $M(\varepsilon_M)$".

PTL 3 and NPL 1 describe how an inexpensive scanning antenna can be obtained by using liquid crystal display (hereinafter referred to as "LCD") device technology.

The present inventors have developed a scanning antenna which can be mass-manufactured by utilizing known manufacturing techniques of LCDs. PTL 6 by the present inventors discloses a scanning antenna which can be mass-manufactured by utilizing the known manufacturing techniques of LCDs, a thin film transistor (TFT) substrate used for such a scanning antenna, and a manufacturing method and a driving method of such a scanning antenna. For reference, the entire contents disclosed in PTL 6 are incorporated herein.

CITATION LIST

Patent Literature

PTL 1: JP 2007-116573 A
PTL 2: JP 2007-295044 A
PTL 3: JP 2009-538565 A
PTL 4: JP 2013-539949 A
PTL 5: WO 2015/126550
PTL 6: WO 2017/061527

Non Patent Literature

NPL 1: R. A. Stevenson et al., "Rethinking Wireless Communications: Advanced Antenna Design using LCD Technology", SID 2015 DIGEST, pp. 827-830.

NPL 2: M. ANDO et al., "A Radial Line Slot Antenna for 12 GHz Satellite TV Reception", IEEE Transactions of Antennas and Propagation, Vol. AP-33, No. 12, pp. 1347-1353 (1985).

SUMMARY

Technical Problem

An object of the disclosure is to further improve the performance of the scanning antenna described in PTL 6.

Solution to Problem

According to the embodiments of the disclosure, there are provided solutions according to the following items.

Item 1

A scanning antenna with a transmission and/or reception region including a plurality of antenna units and a non-transmission and/or reception region other than the transmission and/or reception region, the scanning antenna including:

a TFT substrate including a first dielectric substrate and, a plurality of TFTs, a plurality of gate bus lines, a plurality of source bus lines, and a plurality of patch electrodes, supported by the first dielectric substrate;

a slot substrate including a second dielectric substrate and a slot electrode formed on a first main surface of the second dielectric substrate, the slot electrode including a plurality of slots arranged corresponding to the plurality of patch electrodes;

a liquid crystal layer provided between the TFT substrate and the slot substrate;

a seal portion surrounding the liquid crystal layer;

a wall structure disposed in a region surrounded by the seal portion in the non-transmission and/or reception region;

a reflective conductive plate disposed opposing a second main surface of the second dielectric substrate on a side opposite to the first main surface with a dielectric layer interposed between the reflective conductive plate and the second main surface;

a first spacer structure disposed in the transmission and/or reception region, and defining a first gap between the first dielectric substrate and the second dielectric substrate in the transmission and/or reception region; and a second spacer structure disposed in the wall structure, and defining a second gap between the first dielectric substrate and the second dielectric substrate in the non-transmission and/or reception region, the second gap being wider than the first gap, wherein the wall structure includes a first main side face and a second main side face that intersect a surface of the first dielectric substrate, and at least one of the first main side face and the second main side face includes a plurality of recessed portions and/or a plurality of protruding portions when viewed from a normal direction of the first dielectric substrate.

Item 2

The scanning antenna according to Item 1, wherein a pitch of the plurality of recessed portions and/or the plurality of protruding portions is from 2 mm to 100 mm when viewed from the normal direction of the first dielectric substrate.

Item 3

The scanning antenna according to Item 1 or 2,
wherein the seal portion includes a first granular spacer defining a thickness of the liquid crystal layer in the transmission and/or reception region, and
the second spacer structure includes a second granular spacer having a particle diameter greater than a particle diameter of the first granular spacer.

Item 4

A method for manufacturing a scanning antenna, the scanning antenna being according to any one of Items 1 to 3, the method including: a step for forming the liquid crystal layer, the step for forming the liquid crystal layer includes a step for supplying liquid crystal material to generate a vacuum bubble within a region between the TFT substrate and the slot substrate, and surrounded by the seal portion.

Item 5

The method for manufacturing the scanning antenna according to Item 4, wherein the step for forming the liquid crystal layer further includes a step for increasing a temperature of the liquid crystal layer to 80° C. or more after the step for supplying the liquid crystal material.

Item 6

The method for manufacturing the scanning antenna according to Item 4 or 5, wherein the liquid crystal layer is formed using a vacuum injection method.

Item 7

The method for manufacturing the scanning antenna according to Item 4 or 5, wherein the liquid crystal layer is formed using one drop filling, and
the step for forming the liquid crystal layer includes a step for dropping an amount of liquid crystal material smaller than a volume of the region between the TFT substrate and the slot substrate, and surrounded by the seal portion.

Advantageous Effects of Disclosure

According to an embodiment of the disclosure, the performance of the scanning antenna can be further improved.

DESCRIPTION OF EMBODIMENTS

Figure 1:
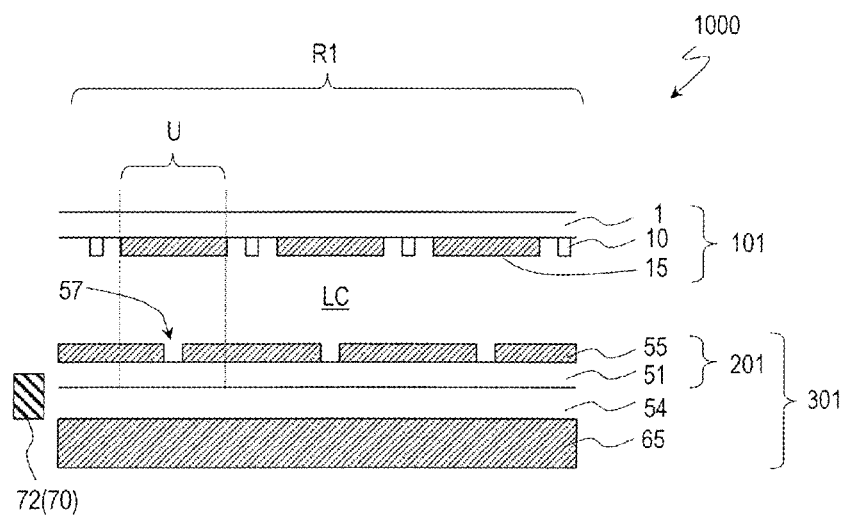
FIG. 1 is a cross-sectional view schematically illustrating a portion of a scanning antenna 1000.

Hereinafter, a scanning antenna, a method for manufacturing the scanning antenna, and a TFT substrate used for the scanning antenna according to embodiments of the disclosure will be described with reference to the drawings. Note that the disclosure is not limited to the embodiments illustrated below. The embodiments of the disclosure are not limited to the drawings. For example, a thickness of a layer in a cross-sectional view, sizes of a conductive portion and an opening in a plan view, and the like are exemplary.

Basic Structure of Scanning Antenna

By controlling the voltage applied to each liquid crystal layer of each antenna unit corresponding to the pixels of the LCD panel and changing the effective dielectric constant M ($\varepsilon_M$) of the liquid crystal layer for each antenna unit, a scanning antenna equipped with an antenna unit that uses the anisotropy (birefringence index) of a large dielectric constant M ($\varepsilon_M$) of a liquid crystal material forms a two-dimensional pattern by antenna units with different electrostatic capacitances (corresponding to displaying of an image by an LCD). An electromagnetic wave (for example, a microwave) emitted from an antenna or received by an antenna is given a phase difference depending on the electrostatic capacitance of each antenna unit and gains a strong directivity in a particular direction depending on the two-dimensional pattern formed by the antenna units having different electrostatic capacitances (beam scanning). For example, an electromagnetic wave emitted from an antenna is obtained by integrating, with consideration for the phase difference provided by each antenna unit, spherical waves obtained as a result of input electromagnetic waves entering each antenna unit and being scattered by each antenna unit. It can be considered that each antenna unit functions as a "phase shifter." For a description of the basic structure and operating principles of a scanning antenna that uses a liquid crystal material, refer to PTL 1 to PTL 4 as well as NPL 1 and NPL 2. NPL 2 discloses the basic structure of a scanning antenna in which spiral slots are arranged. For reference, the entire contents of the disclosures of PTL 1 to PTL 4 as well as NPL 1 and NPL 2 are incorporated herein.

Note that although the antenna units in the scanning antenna are similar to pixels in an LCD panel, the structure of the antenna units is different from the structure of pixels in an LCD panel, and the arrangement of the plurality of antenna units is also different from the arrangement of pixels in an LCD panel. A basic structure of the scanning antenna will be described with reference to FIG. 1, which illustrates a scanning antenna 1000 described in PTL 6. The scanning antenna 1000 is a radial in-line slot antenna in which slots are concentrically arranged. However, the scanning antenna according to embodiments of the disclosure is not limited thereto. For example, the slots may be arranged in any known arrangement. In particular, with respect to the slot and/or antenna unit arrangements, the entire disclosure of PTL 5 is incorporated herein by reference.

FIG. 1 is a cross-sectional view schematically illustrating a portion of the scanning antenna 1000 and schematically illustrates a partial cross-section taken along a radial direction from a power feed pin 72 (see FIG. 2B) provided at or near the center of the concentrically arranged slots.

The scanning antenna 1000 includes a TFT substrate 101, a slot substrate 201, a liquid crystal layer LC provided therebetween, and a reflective conductive plate 65 opposing the slot substrate 201 with an air layer 54 interposed between the slot substrate 201 and the reflective conductive plate 65. The scanning antenna 1000 transmits and/or receives microwaves to and/or from a side closer to the TFT substrate 101.

The TFT substrate 101 includes a dielectric substrate 1 such as a glass substrate, a plurality of patch electrodes 15 and a plurality of TFTs 10 formed on the dielectric substrate 1. Each patch electrode 15 is connected to a corresponding TFT 10. Each TFT 10 is connected to a gate bus line and a source bus line.

The slot substrate 201 includes a dielectric substrate 51 such as a glass substrate and a slot electrode 55 formed on a side of the dielectric substrate 51 closer to the liquid crystal layer LC. The slot electrode 55 includes a plurality of slots 57.

The reflective conductive plate 65 is disposed opposing the slot substrate 201 with the air layer 54 interposed between the reflective conductive plate 65 and the slot substrate 201. In place of the air layer 54, a layer formed of a dielectric (e.g., a fluorine resin such as PTFE) having a small dielectric constant M for microwaves can be used. The slot electrode 55, the reflective conductive plate 65, and the dielectric substrate 51 and the air layer 54 therebetween function as a waveguide 301.

The patch electrode 15, the portion of the slot electrode 55 including the slot 57, and the liquid crystal layer LC therebetween constitute an antenna unit U. In each antenna unit U, one patch electrode 15 opposes a portion of the slot electrode 55 including one slot 57 with the liquid crystal layer LC interposed therebetween, thereby constituting liquid crystal capacitance. The structure in which the patch electrode 15 and the slot electrode 55 oppose each other with the liquid crystal layer LC interposed therebetween is similar to the structure in which the pixel electrode and the counter electrode in an LCD panel oppose each other with the liquid crystal layer interposed therebetween. That is, the antenna unit U of the scanning antenna 1000 and the pixel in an LCD panel have a similar configuration. The antenna unit has a configuration similar to that of the pixel in an LCD panel in that the antenna unit has an auxiliary capacity electrically connected in parallel with the liquid crystal capacitance. However, the scanning antenna 1000 has many differences from the LCD panel.

First, the performance required for the dielectric substrates 1 and 51 of the scanning antenna 1000 is different from the performance required for the substrate of the LCD panel.

Generally, transparent substrates that are transparent to visible light are used for LCD panels. For example, glass substrates or plastic substrates are used. In reflective LCD panels, since the substrate on the back side does not need transparency, a semiconductor substrate may be used in some cases. In contrast to this, it is preferable for the dielectric substrates 1 and 51 used for the antennas to have small dielectric losses with respect to microwaves (where the dielectric tangent with respect to microwaves is denoted as tan $\delta_M$). The tan $\delta_M$ of each of the dielectric substrates 1 and 51 is preferably approximately less than or equal to 0.03, and more preferably less than or equal to 0.01. Specifically, a glass substrate or a plastic substrate can be used. Glass substrates are superior to plastic substrates with respect to dimensional stability and heat resistance, and are suitable for forming circuit elements such as TFTs, a wiring line, and electrodes using LCD technology. For example, in a case where the materials forming the waveguide are air and glass, as the dielectric loss of glass is greater, from the viewpoint that thinner glass can reduce the waveguide loss, it is preferable for the thickness to be less than or equal to 400 µm, and more preferably less than or equal to 300 µm. There is no particular lower limit, provided that the glass can be handled such that it does not break in the manufacturing process.

The conductive material used for the electrode is also different. In many cases, an ITO film is used as a transparent conductive film for pixel electrodes and counter electrodes of LCD panels. However, ITO has a large tan $\delta_M$ with respect to microwaves, and as such cannot be used as the conductive layer in an antenna. The slot electrode 55 functions as a wall for the waveguide 301 together with the reflective conductive plate 65. Accordingly, to suppress the transmission of microwaves in the wall of the waveguide 301, it is preferable that the thickness of the wall of the waveguide 301, that is, the thickness of the metal layer (Cu layer or Al layer) be large. It is known that in a case where the thickness of the metal layer is three times the skin depth, electromagnetic waves are attenuated to 1/20 (−26 dB), and in a case where the thickness is five times the skin depth, electromagnetic waves are attenuated to about 1/150 (−43 dB). Accordingly, in a case where the thickness of the metal layer is five times the skin depth, the transmittance of electromagnetic waves can be reduced to 1%. For example, for a microwave of 10 GHz, in a case where a Cu layer having a thickness of greater than or equal to 3.3 μm and an Al layer having a thickness of greater than or equal to 4.0 μm are used, microwaves can be reduced to 1/150. In addition, for a microwave of 30 GHz, in a case where a Cu layer having a thickness of greater than or equal to 1.9 μm and an Al layer having a thickness of greater than or equal to 2.3 μm are used, microwaves can be reduced to 1/150. In this way, the slot electrode 55 is preferably formed of a relatively thick Cu layer or Al layer. There is no particular upper limit for the thickness of the Cu layer or the Al layer, and the thicknesses can be set appropriately in consideration of the time and cost of film formation. The usage of a Cu layer provides the advantage of being thinner than the case of using an Al layer. Relatively thick Cu layers or Al layers can be formed not only by the thin film deposition method used in LCD manufacturing processes, but also by other methods such as bonding Cu foil or Al foil to the substrate. The thickness of the metal layer, for example, ranges from 2 μm to 30 μm. In a case where the thin film deposition methods are used, the thickness of the metal layer is preferably less than or equal to 5 μm. Note that aluminum plates, copper plates, or the like having a thickness of several mm can be used as the reflective conductive plate 65, for example.

Since the patch electrode 15 does not configure the waveguide 301 like the slot electrode 55, a Cu layer or an Al layer can be used that has a smaller thickness than that of the slot electrode 55. However, to avoid losses caused by heat when the oscillation of free electrons near the slot 57 of the slot electrode 55 induces the oscillation of the free electrons in the patch electrode 15, it is preferable that the resistance be low. From the viewpoint of mass manufacture, it is preferable to use an Al layer rather than a Cu layer, and the thickness of the Al layer is preferably greater than or equal to 0.3 μm and less than or equal to 2 μm, for example.

The arrangement pitch of the antenna units U is considerably different from that of the pixel pitch. For example, considering an antenna for microwaves of 12 GHz (Ku band), the wavelength λ is 25 mm, for example. Then, as described in PTL 4, since the pitch of the antenna unit U is less than or equal to λ/4 and/or less than or equal to λ/5, the pitch becomes less than or equal to 6.25 mm and/or less than or equal to 5 mm. This is ten times greater than the pitch of pixels in an LCD panel. Accordingly, the length and width of the antenna unit U are also roughly ten times greater than the pixel length and width of the LCD panel.

Of course, the array of the antenna units U may be different from the array of the pixels in the LCD panel. Herein, although an example is illustrated in which the antenna units U are arrayed cocentrically (for example, refer to JP 2002-217640 A), the present disclosure is not limited thereto, and the antenna units may be arrayed in a spiral shape as described in NPL 2, for example. Furthermore, the antenna units may be arrayed in a matrix as described in PTL 4.

The properties required for the liquid crystal material of the liquid crystal layer LC of the scanning antenna 1000 are different from the properties required for the liquid crystal material of the LCD panel. In the LCD panel, a change in refractive index of the liquid crystal layer of the pixels allows a phase difference to be provided to the polarized visible light (wavelength of from 380 nm to 830 nm) such that the polarization state is changed (for example, allowing the polarization axis direction of linearly polarized light to be rotated or the degree of circular polarization of circularly polarized light to be changed), whereby display is performed. In contrast, in the scanning antenna 1000, the phase of the microwave excited (re-radiated) from each patch electrode is changed by changing the electrostatic capacitance value of the liquid crystal capacitance of the antenna unit U. Accordingly, the liquid crystal layer preferably has a large anisotropy ($\Delta\varepsilon_M$) of the dielectric constant M ($\varepsilon_M$) for microwaves, and tan $\delta_M$ is preferably small. For example, the $\Delta\varepsilon_M$ of greater than or equal to 4 and tan $\delta_M$ of less than or equal to 0.02 (values of 19 GHz in both cases) described in SID 2015 DIGEST pp. 824-826 written by M. Wittek et al, can be suitably used. In addition, it is possible to use a liquid crystal material having a $\Delta\varepsilon_M$ of greater than or equal to 0.4 and tan $\delta_M$ of less than or equal to 0.04 as described in POLYMERS 55 vol. August issue pp. 599-602 (2006), written by Kuki.

In general, the dielectric constant of a liquid crystal material has a frequency dispersion, but the dielectric anisotropy $\Delta\varepsilon_M$ for microwaves has a positive correlation with the refractive index anisotropy Δn with respect to visible light. Accordingly, it can be said that a material having a large refractive index anisotropy $\Delta_n$ with respect to visible light is preferable as a liquid crystal material for an antenna unit for microwaves. The refractive index anisotropy $\Delta_n$ of the liquid crystal material for LCDs is evaluated by the refractive index anisotropy for light having a wavelength of 550 nm. Here again, when $\Delta_n$ (birefringence index) is used as an index for light having a wavelength of 550 nm, a nematic liquid crystal having a $\Delta_n$ of greater than or equal to 0.3, preferably greater than or equal to 0.4, can be used for an antenna unit for microwaves. The value $\Delta_n$ has no particular upper limit. However, since liquid crystal materials having a large Δn tend to have a strong polarity, there is a possibility that reliability may decrease. The thickness of the liquid crystal layer is, for example, from 1 μm to 500 μm.

Hereinafter, the structure of the scanning antenna will be described in more detail.

Figure 2A:
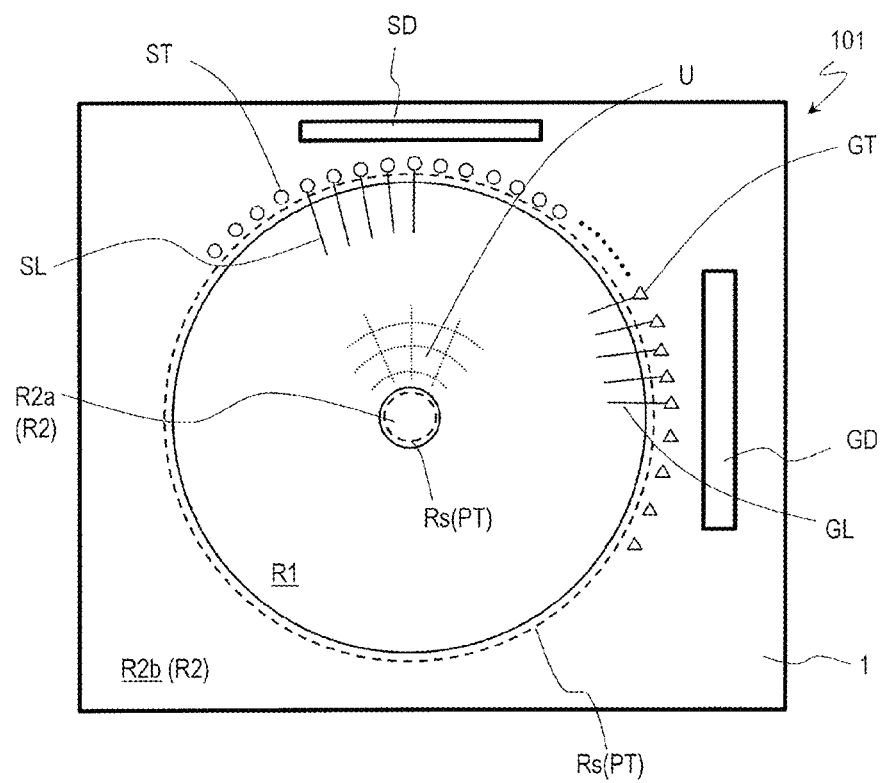
FIG. 2A is a schematic plan view illustrating a TFT substrate 101 included in the scanning antenna 1000.
Figure 2B:
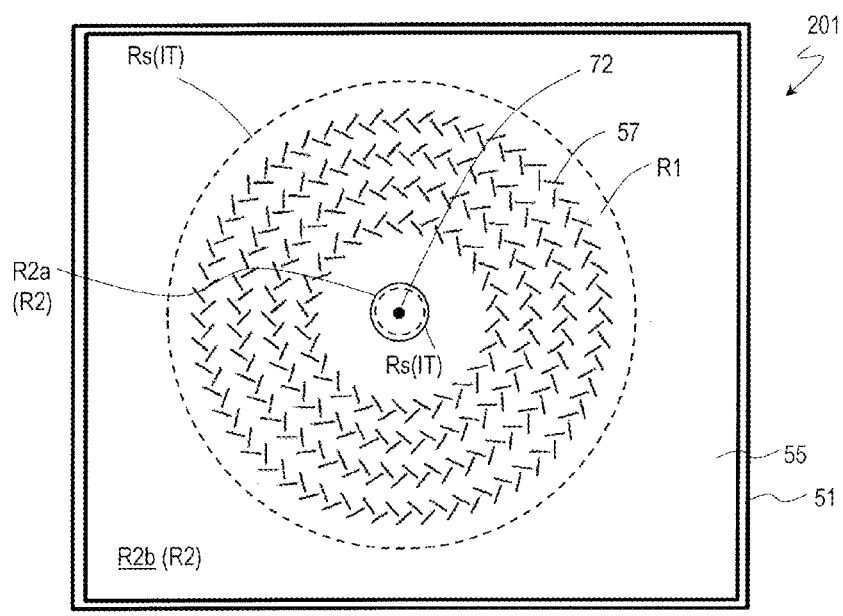
FIG. 2B is a schematic plan view illustrating a slot substrate 201 included in the scanning antenna 1000.

First, a description is given with reference to FIG. 1, FIG. 2A, and FIG. 2B. FIG. 1 is a schematic partial cross-sectional view of the scanning antenna 1000 near the center thereof as described above in detail, and FIG. 2A and FIG. 2B are schematic plan views illustrating the TFT substrate 101 and the slot substrate 201 included in the scanning antenna 1000, respectively.

The scanning antenna 1000 includes a plurality of the antenna units U arranged two-dimensionally. In the scanning antenna 1000 exemplified here, the plurality of antenna units U are arranged concentrically. In the following description, the region of the TFT substrate 101 and the region of the slot substrate 201 corresponding to the antenna unit U will be referred to as "antenna unit region," and be denoted with the same reference numeral U as the antenna unit. In addition, as illustrated in FIG. 2A and FIG. 2B, in the TFT substrate 101 and the slot substrate 201, a region defined by the plurality of antenna unit regions that are two-dimensionally arranged is referred to as a "transmission and/or reception region R1," and a region other than the transmission and/or reception region R1 is referred to as a "non-transmission and/or reception region R2." A terminal section, a drive circuit, and the like are provided in the non-transmission and/or reception region R2.

FIG. 2A is a schematic plan view illustrating the TFT substrate 101 included in the scanning antenna 1000.

In the illustrated example, the transmission and/or reception region R1 has a donut-shape when viewed from a normal direction of the TFT substrate 101. The non-transmission and/or reception region R2 includes a first non-transmission and/or reception region R2a located at the center of the transmission and/or reception region R1 and a second non-transmission and/or reception region R2b located at a peripheral portion of the transmission and/or reception region R1. An outer diameter of the transmission and/or reception region R1, for example, is from 200 mm to 1500 mm and is configured according to communication traffic volume or other factors.

A plurality of gate bus lines GL and a plurality of source bus lines SL supported by the dielectric substrate 1 are provided in the transmission and/or reception region R1 of the TFT substrate 101, and the antenna unit regions U are defined by these wiring lines. The antenna unit regions U are, for example, arranged concentrically in the transmission and/or reception region R1. Each of the antenna unit regions U includes a TFT and a patch electrode electrically connected to the TFT. The source electrode of the TFT is electrically connected to the source bus line SL, and the gate electrode is electrically connected to the gate bus line GL. In addition, the drain electrode is electrically connected to the patch electrode.

In the non-transmission and/or reception region R2 (R2a, R2b), a seal region Rs is disposed surrounding the transmission and/or reception region R1. A sealing member is applied to the seal region Rs. The sealing member bonds the TFT substrate 101 and the slot substrate 201 to each other, and also encloses liquid crystals between these substrates 101 and 201.

A gate terminal section GT, a gate driver GD, a source terminal section ST, and a source driver SD are provided outside a region of the non-transmission and/or reception region R2 surrounded by the seal region Rs. Each of the gate bus lines GL is connected to the gate driver GD with the gate terminal section GT interposed therebetween. Each of the source bus lines SL is connected to the source driver SD with the source terminal section ST therebetween. Note that, in this example, although the source driver SD and the gate driver GD are formed on the dielectric substrate 1, one or both of these drivers may be provided on another dielectric substrate.

Also, a plurality of transfer terminal sections PT are provided in the non-transmission and/or reception region R2. The transfer terminal sections PT are electrically connected to the slot electrode 55 (FIG. 2B) of the slot substrate 201. In the present specification, the connection section between the transfer terminal sections PT and the slot electrode 55 is referred to as a "transfer section." As illustrated in the drawings, the transfer terminal sections PT (transfer section) may be disposed in the seal region Rs. In this case, a resin containing conductive particles may be used as the sealing member. In this way, liquid crystals are sealed between the TFT substrate 101 and the slot substrate 201, and an electrical connection can be secured between the transfer terminal sections PT and the slot electrode 55 of the slot substrate 201. In this example, although a transfer terminal section PT is disposed in both the first non-transmission and/or reception region R2a and the second non-transmission and/or reception region R2b, the transfer terminal sections PT may be disposed in only one of the first non-transmission and/or reception region R2a and the second non-transmission and/or reception region R2b.

Note that the transfer terminal sections PT (transfer sections) need not be disposed in the seal region Rs. For example, the transfer terminal sections PT may be disposed in a region of the non-transmission and/or reception region R2 other than the seal region Rs. Needless to say, the transfer sections may be disposed both within the seal region Rs and outside the seal region Rs.

FIG. 2B is a schematic plan view illustrating the slot substrate 201 in the scanning antenna 1000 and illustrates the surface of the slot substrate 201 closer to the liquid crystal layer LC.

In the slot substrate 201, the slot electrode 55 is formed on the dielectric substrate 51 extending across the transmission and/or reception region R1 and the non-transmission and/or reception region R2.

In the transmission and/or reception region R1 of the slot substrate 201, the plurality of slots 57 are formed in the slot electrode 55. The slots 57 are formed corresponding to the antenna unit regions U on the TFT substrate 101. For the plurality of slots 57 in the illustrated example, a pair of the slots 57 extending in directions substantially orthogonal to each other are concentrically arranged so that a radial in-line slot antenna is configured. Since the scanning antenna 1000 includes slots that are substantially orthogonal to each other, the scanning antenna 1000 can transmit and/or receive circularly polarized waves.

A plurality of terminal sections IT of the slot electrode 55 are provided in the non-transmission and/or reception region R2. The terminal sections IT are electrically connected to the transfer terminal sections PT (FIG. 2A) of the TFT substrate 101. In this example, the terminal sections IT are disposed within the seal region Rs and are electrically connected to corresponding transfer terminal sections PT using a sealing member containing conductive particles.

In addition, the power feed pin 72 is disposed on a back face side of the slot substrate 201 in the first non-transmission and/or reception region R2a. The power feed pin 72 allows microwaves to be inserted into the waveguide 301 constituted by the slot electrode 55, the reflective conductive plate 65, and the dielectric substrate 51. The power feed pin 72 is connected to a power feed device 70. Power feeding is performed from the center of the concentric circle in which the slots 57 are arranged. The power feed method may be either a direct coupling power feed method or an electromagnetic coupling method, and a known power feed structure can be utilized.

Figure 3:
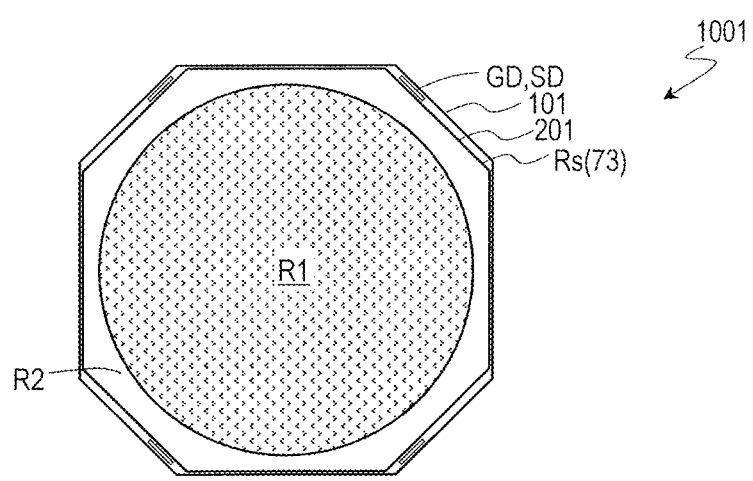
FIG. 3 is a schematic plan view of a scanning antenna 1001 of a modification example of the scanning antenna 1000.

In FIG. 2A and FIG. 2B, an example is illustrated in which the seal region Rs is provided so as to surround a relatively narrow region including the transmission and/or reception region R1, but the arrangement of the seal region Rs is not limited to this. FIG. 3 is a schematic plan view of a scanning antenna 1001 of a modification example of the scanning antenna 1000. For example, as illustrated in an example of FIG. 3, the seal region Rs provided outside the transmission and/or reception region R1 may be provided at or near the side of the dielectric substrate 1 and/or the dielectric substrate 51, for example, so as to maintain a certain distance or more from the transmission and/or reception region R1. Specifically, in the example illustrated in FIG. 3, a region surrounded by the seal region Rs includes the transmission and/or reception region R1 and a portion of the non-transmission and/or reception region R2. Of course, the terminal section and the drive circuit (including the gate driver GD and the source driver SD), for example, that are provided in the non-transmission and/or reception region R2 may be formed outside the region surrounded by the seal region Rs (that is, the side where the liquid crystal layer is not present). In general, the portion of the TFT substrate 101 including a terminal section and a drive circuit (e.g., the gate driver GD, the source driver SD, the source terminal section ST, and the gate terminal section GT) is exposed without overlapping the slot substrate 201. In FIG. 3, for simplicity, an edge of the slot substrate 201 and the seal region Rs (seal portion 73) are illustrated without distinction, but the edge of the slot substrate 201 is between the seal region Rs (seal portion 73) and an edge of the TFT substrate 101. The following drawings may also be similarly illustrated for simplicity. By forming the seal region Rs at a position separated from the transmission and/or reception region R1 by a certain distance or more, it is possible to prevent the antenna characteristics from deteriorating due to the influence of impurities (in particular, ionic impurities) contained in the sealing member (in particular, a curable resin).

The scanning antenna 1000 and the scanning antenna 1001 may be prepared by tiling a plurality of scanning antenna portions as described in, for example, WO 2017/065088, the application of which is filed by the applicant of this application. For example, the scanning antenna can be prepared by dividing the liquid crystal panels of the scanning antenna. The liquid crystal panels of the scanning antenna each include: a TFT substrate; a slot substrate; and a liquid crystal layer provided therebetween. The air layer (or other dielectric layer) 54 and the reflective conductive plate 65 may be provided in common across the plurality of scanning antenna portions.

Figure 4A:
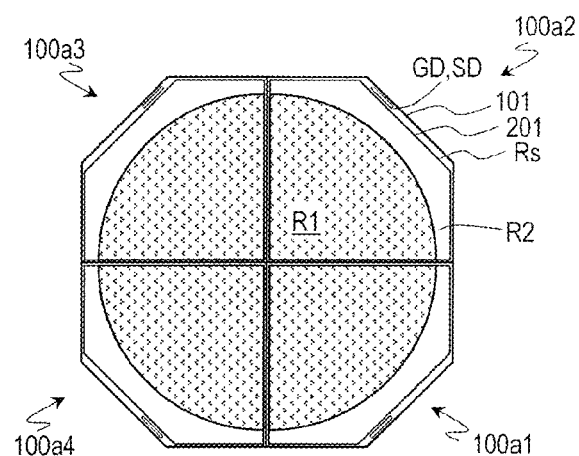
FIG. 4A is a diagram illustrating an example of a tiling structure of the scanning antenna 1001.
Figure 4B:
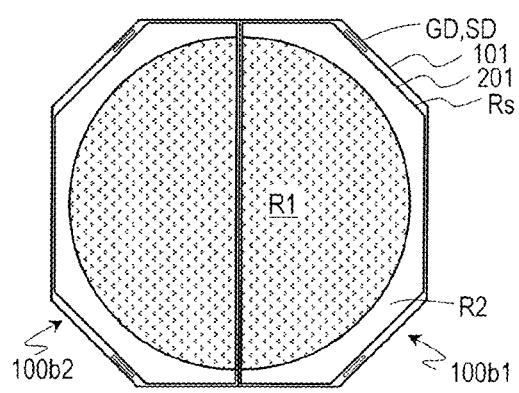
FIG. 4B is a diagram illustrating an example of the tiling structure of the scanning antenna 1001.

FIG. 4A and FIG. 4B illustrate examples of a tiling structure of the liquid crystal panel included in the scanning antenna 1001. For example, the liquid crystal panel of the scanning antenna 1001 may be prepared by tiling four liquid crystal panels 100a1 to 100a4 as illustrated in FIG. 4A, or may be prepared by tiling two liquid crystal panels 100b1 and 100b2 as illustrated in FIG. 4B. For simplicity, constituent elements included in the scanning antenna portions may be denoted by reference signs the same as the scanning antenna.

Figure 4C:
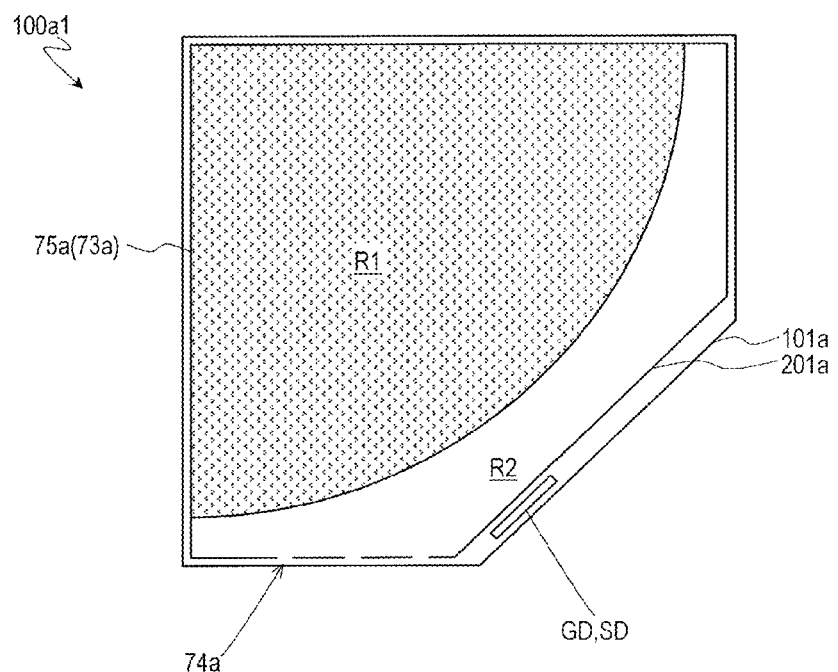
FIG. 4C is a schematic plan view illustrating a liquid crystal panel 100a1 included in the scanning antenna 1001.

FIG. 4C illustrates a schematic plan view of the liquid crystal panel 100a1. As illustrated in FIG. 4C, the liquid crystal panel 100a1 includes a TFT substrate 101a, a slot substrate 201a, a liquid crystal layer LC provided therebetween, and a seal portion 73a surrounding the liquid crystal layer LC. The slot substrate 201a and the TFT substrate 101a are adhered and fixed to each other by a sealing member that forms the seal portion 73a. For example, the seal portion 73a includes a main seal portion 75a and an end seal portion (not illustrated). In the illustrated example, the seal portion 73a is formed to surround the transmission and/or reception region R1 and a portion of the non-transmission and/or reception region R2. The non-transmission and/or reception region R2 is a region other than the transmission and/or reception region R1, as described above. The TFT substrate 101a and the slot substrate 201a of the liquid crystal panel 100a1 constitute the TFT substrate 101 and the slot substrate 201 of the scanning antenna 1001, and thus, may be referred to as the TFT substrate 101 and the slot substrate 201, respectively, in the following description. Note that in FIG. 3, FIG. 4A, FIG. 4B, and FIG. 4C, the transmission and/or reception region R1 is hatched.

The seal portion 73a is formed as follows. First, a sealing member is used to draw a pattern having an opening at portion serving as an injection port 74a on one of the slot substrate 201a and the TFT substrate 101a using, for example, a dispenser. Instead of using a dispenser to draw with the sealing member, the sealing member may be applied in a predetermined pattern by screen printing, for example. After that, one and the other of the above substrates are overlaid on one another, and heated for a predetermined time at a predetermined temperature with a pressure being applied to cure the sealing member. A granular spacer (e.g., resin beads or glass beads) for controlling the cell gap is mixed into the sealing member, and the slot substrate 201a and the TFT substrate 101a are bonded and fixed to each other with a gap, in which the liquid crystal layer LC is formed, being maintained therebetween. Accordingly, the main seal portion 75a is formed.

Next, the liquid crystal layer LC is formed. A liquid crystal material is injected through the injection port 74a using vacuum injection. Then, for example, a thermosetting-type sealant is applied to close the injection port 74a, and the sealant is heated at a predetermined temperature for a predetermined time, to thereby cure the sealant and form the end seal portion. In a case where vacuum injection is used, the main seal portion 75a and the end seal portion form the entire seal portion 73a surrounding the liquid crystal layer LC in this way. Note that the liquid crystal layer LC may be formed using one drop filling. In the case where one drop filling is used, the main seal portion is formed to surround the liquid crystal layer LC, and thus, the injection port and the end seal portion are not formed.

Note that when a plurality of TFT substrates are prepared from one mother glass substrate and a plurality of slot substrates are prepared from a single mother glass substrate, after the mother glass substrates are bonded together to form the seal portion, portions corresponding to each liquid crystal panel need only be cut out by dicing or laser processing, for example, before forming the liquid crystal layers.

As described above, the scanning antenna controls the voltage applied to each liquid crystal layer of each antenna unit to change the effective dielectric constant M ($\varepsilon_M$) of the liquid crystal layer for each antenna unit, and thereby, forms a two-dimensional pattern by antenna units with different electrostatic capacitances. However, the electrostatic capacitance values of the antenna units may vary. For example, the volume of liquid crystal material may change depending on the environment temperature of the scanning antenna, and therefore the electrostatic capacitance value of the liquid crystal capacitance may change. As a result, the phase difference given by the liquid crystal layer of the antenna unit to the microwave deviates from a predetermined value. In a case where the phase difference deviates from a predetermined value, the antenna characteristics are deteriorated. This deterioration of the antenna characteristics can be evaluated as a shift in the resonance frequency, for example. In reality, because the scanning antenna is designed to, for example, maximize gain at a predetermined resonance frequency, a reduction in antenna characteristics due to a shift in the resonance frequency appears as a change in gain, for example. Alternatively, in a case where the direction in which the gain of the scanning antenna is maximized deviates from the desired direction, the communication satellite cannot be accurately tracked, for example.

A problem (problem 1) that may cause decrease in antenna performance in the scanning antenna 1000 or the scanning antenna 1001 will be specifically described.

Immediately after the liquid crystal layer LC of the scanning antenna 1000 or the scanning antenna 1001 is formed, a vacuum bubble is little generated in the liquid crystal layer LC in general. The liquid crystal layer LC being formed refers to, for example, the liquid crystal material being injected between the TFT substrate 101 and the slot substrate 201 and within the region surrounded by the seal portion 73. The liquid crystal layer may be formed by vacuum injection or may be formed by one drop filling. In a process for forming the liquid crystal layer, an insufficient supply amount of liquid crystal material causes a state in which the liquid crystal material is locally insufficient, which may result in an air bubble (also referred to as "vacuum bubble") generation. In a case where a vacuum bubble is generated in the liquid crystal layer LC of the antenna unit U, an electrostatic capacitance value of the liquid crystal capacitance changes, which may lead to the decrease in the antenna characteristics. Therefore, in order to avoid the vacuum bubble generation in the liquid crystal layer, the supply amount of liquid crystal material is generally prevented from being insufficient in the process for forming the liquid crystal layer. However, in this case, in a case where the volume of liquid crystal material included in the liquid crystal layer LC changes after the liquid crystal layer LC is formed, a thickness of the liquid crystal layer LC changes due to deflection of the dielectric substrate 1 included in the TFT substrate 101 and/or the dielectric substrate 51 included in the slot substrate 201. The dielectric substrates 1 and 51 are, for example, glass substrates. In a case where the liquid crystal material thermally expands, the thickness of the liquid crystal layer LC increases, and in a case where the liquid crystal material thermally shrinks, the thickness of the liquid crystal layer LC decreases. In a case where the thickness of the liquid crystal layer LC changes, the electrostatic capacitance value of the liquid crystal capacitance changes, which may result in the decrease in the antenna characteristics.

Figure 5:
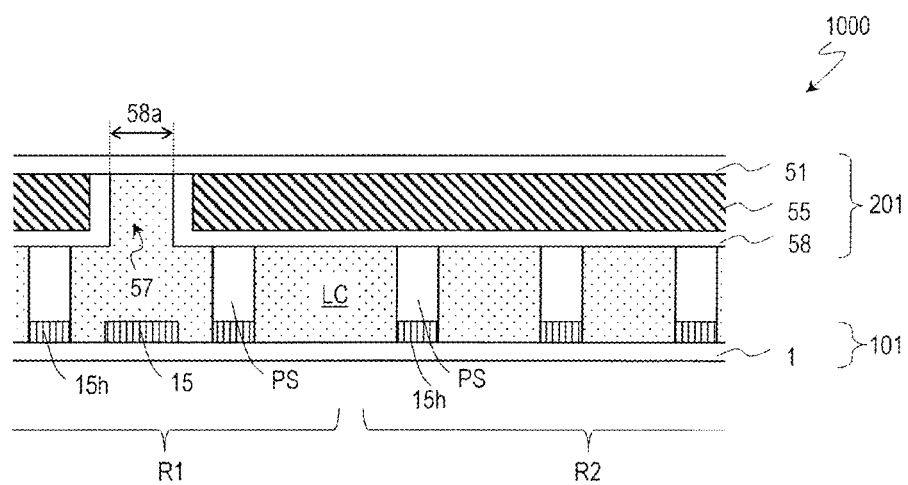
FIG. 5 is a schematic cross-sectional view of a region surrounded by a seal portion 73 of the scanning antenna 1001.

Another problem (problem 2) that may cause the decrease in the antenna performance in the scanning antenna 1000 and the scanning antenna 1001 will be described with reference to FIG. 5. FIG. 5 is a schematic cross-sectional view of a region surrounded by the seal portion 73 of the scanning antenna 1001. In FIG. 5, illustration of the reflective conductive plate 65 and the dielectric layer 54 (FIG. 1) are omitted. Hereinafter, illustration of the reflective conductive plate 65 and the dielectric layer 54 (the dielectric layer 54 provided between the reflective conductive plate 65 and the dielectric substrate 51) may be omitted in the cross-sectional view of the scanning antenna. Here, as illustrated in FIG. 3, the seal portion 73 is formed to surround the transmission and/or reception region R1 and a portion of non-transmission and/or reception region R2. The non-transmission and/or reception region R2 is a region other than the transmission and/or reception region R1, as described above. Here, a boundary line between the transmission and/or reception region R1 and the non-transmission and/or reception region R2 can be, for example, a line including a point that is 2 mm or more away from the outermost antenna unit.

As illustrated in FIG. 5, a columnar spacer (photo spacer) PS for controlling the cell gap is provided in the transmission and/or reception region R1. Specifically, in order to make the thickness of the liquid crystal layer LC uniform, a columnar photo spacer formed using an ultraviolet-curing resin is disposed on at least one of the TFT substrate 101 and the slot substrate 201. As illustrated in the drawing, the columnar spacer PS may also be provided in the non-transmission and/or reception region R2. In a configuration provided with the columnar spacer PS, even in a case where the temperature drops and the liquid crystal material thermally shrinks, changes in the cell gap are suppressed by the columnar spacer PS. In other words, the deflection of the TFT substrate 101 and/or the slot substrate 201 is suppressed to a certain degree, and thus, the changes in the thickness of the liquid crystal layer LC are suppressed. However, because the columnar spacer does not follow the decrease in the volume of liquid crystal material due to thermal shrinkage, a vacuum bubble may be generated around the columnar spacer at a low temperature. A vacuum bubble generated in this manner is also referred to as a "low-temperature air bubble". In particular, in the case where a vacuum bubble is generated around the columnar spacer PS in the transmission and/or reception region R1, the electrostatic capacitance value of the liquid crystal capacitance may change, and as a result, the antenna characteristics may decrease.

The scanning antenna according to an embodiment of the disclosure can suppress these problems to suppress the decrease in the antenna performance in wide range of temperature, in other words, at from a high temperature to a low temperature.

Figure 6A:
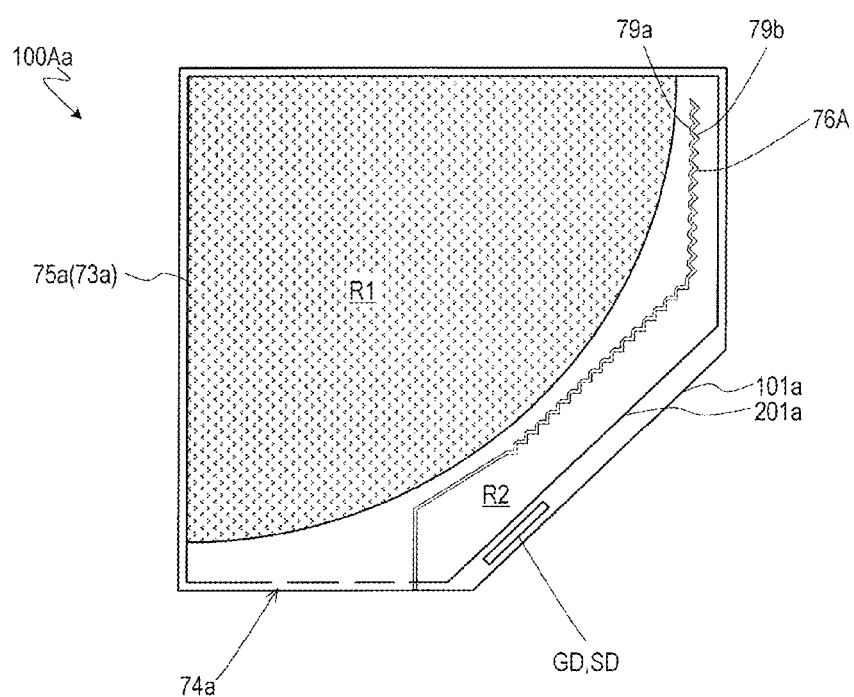
FIG. 6A is a schematic plan view of one liquid crystal panel 100Aa for preparing a liquid crystal panel of the scanning antenna according to an embodiment of the disclosure by tiling four liquid crystal panels.
Figure 6B:
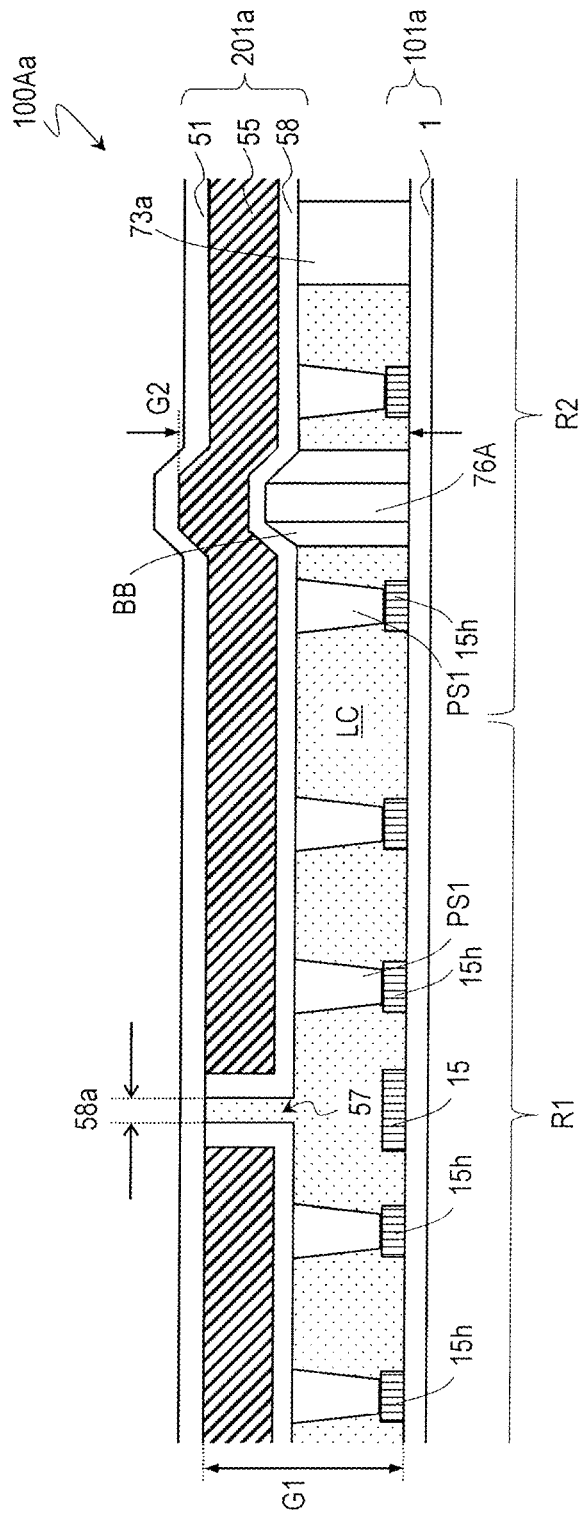
FIG. 6B is a schematic cross-sectional view of the liquid crystal panel 100Aa.

A scanning antenna according to an embodiment of the disclosure will described with reference to FIG. 6A and FIG. 6B. FIG. 6A is a schematic plan view of one liquid crystal panel 100Aa for preparing a liquid crystal panel of the scanning antenna according to the embodiment of the disclosure by tiling four liquid crystal panels. FIG. 6B is a schematic cross-sectional view of the liquid crystal panel 100Aa. Common reference numerals may be assigned to the configuration common to the scanning antenna 1000 or the scanning antenna 1001, and descriptions thereof may be omitted. In the following, an example is described in which the scanning antenna divided into four is prepared, but the embodiment of the disclosure is not limited thereto.

As illustrated in FIG. 6A and FIG. 6B, the seal portion 73a of the liquid crystal panel 100Aa is formed to surround the transmission and/or reception region R1 and a portion of the non-transmission and/or reception region R2 as in the scanning antenna 1001 illustrated in FIG. 3. In FIG. 6A, the transmission and/or reception region R1 is hatched. The liquid crystal panel 100Aa differs from the liquid crystal panel 100a in that the liquid crystal panel 100Aa further includes an additional seal portion 76A disposed in the region surrounded by the seal portion 73a in the non-transmission and/or reception region R2. As illustrated in FIG. 6B, a gap G2 between the first dielectric substrate 1 and the second dielectric substrate 51 in the additional seal portion 76A is larger than a gap G1 between the first dielectric substrate 1 and the second dielectric substrate 51 in the transmission and/or reception region R1. Note that the left side of the seal portion 73a in FIG. 6B indicates the region surrounded by the seal portion 73a. As illustrated in FIG. 6A, the additional seal portion 76A includes a first main side face 79a and a second main side face 79b that intersect a surface of the first dielectric substrate 1, and the first main side face 79a and the second main side face 79b include a plurality of recessed portions and/or a plurality of protruding portions when viewed from the normal direction of the first dielectric substrate 1. Specifically, when viewed from the normal direction of the first dielectric substrate 1, the first main side face 79a and the second main side face 79b have a concave-convex structure. In other words, assuming that a shape of the additional seal portion 76A when viewed from the normal direction of the first dielectric substrate 1 is a planar shape of the additional seal portion 76A, the planar shape of the additional seal portion 76A includes a plurality of recessed portions and/or a plurality of protruding portions.

As illustrated in FIG. 6B, in a process for forming the liquid crystal layer LC in the scanning antenna prepared using the liquid crystal panel 100Aa, a vacuum bubble (vacuum region) BB is intentionally generated in the liquid crystal layer LC (that is, a region between the TFT substrate 101a and the slot substrate 201a, and surrounded by the seal portion 73a). This suppresses the change in the thickness of the liquid crystal layer LC due to the change in the volume of liquid crystal material. In other words, the change in the thickness of the liquid crystal layer LC is suppressed by that the vacuum bubble absorbs the change in the volume of liquid crystal material. At this time, since the additional seal portion 76A is included in the non-transmission and/or reception region R2, the position of the vacuum bubble (vacuum region) BB generated in the process for forming the liquid crystal layer LC can be controlled to suppress the formation of the vacuum bubble in the transmission and/or reception region R1. This is because in the process for forming the liquid crystal layer LC, the vacuum bubble (vacuum region) tends to be easily formed in a region where the distance between the TFT substrate and the slot substrate is the largest. Furthermore, since the additional seal portion 76A has the concave-convex structure on the side face (the surface that may contact the liquid crystal material), a vacuum bubble is easily formed around the concave-convex structure, and thus, the position of the vacuum bubble can be controlled with even higher accuracy. Although it depends on a size of the region surrounded by the seal portion 73a, for example, at the temperature of the liquid crystal layer LC is 25° C. (room temperature), an area of the vacuum bubble is preferably from 2% to 21% of an area of the region surrounded by the seal portion 73a when viewed from the normal direction of the dielectric substrate 1.

Figure 6C:
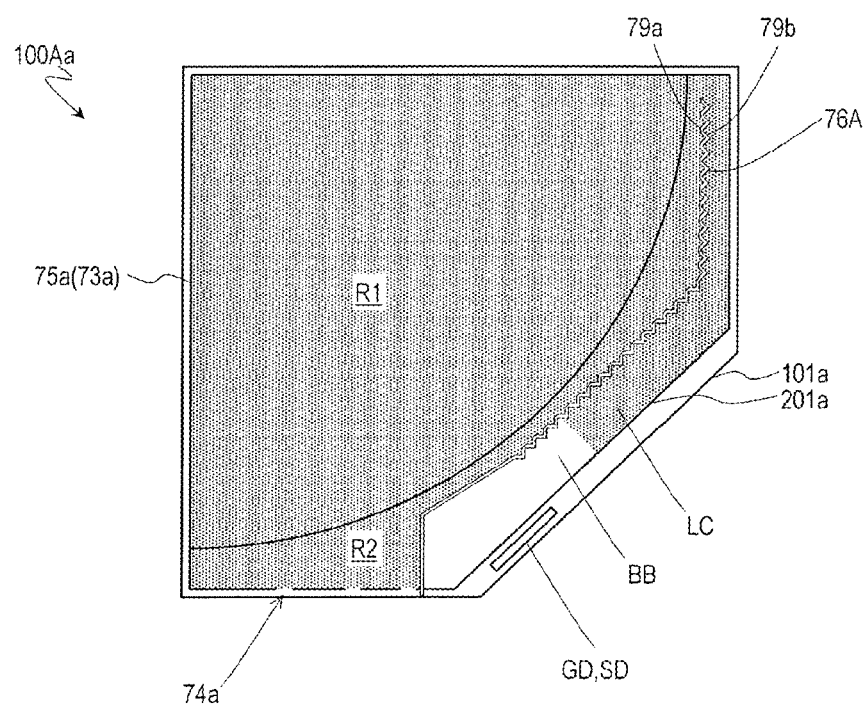
FIG. 6C is a schematic plan view of the liquid crystal panel 100Aa immediately after a liquid crystal material is injected.
Figure 6D:
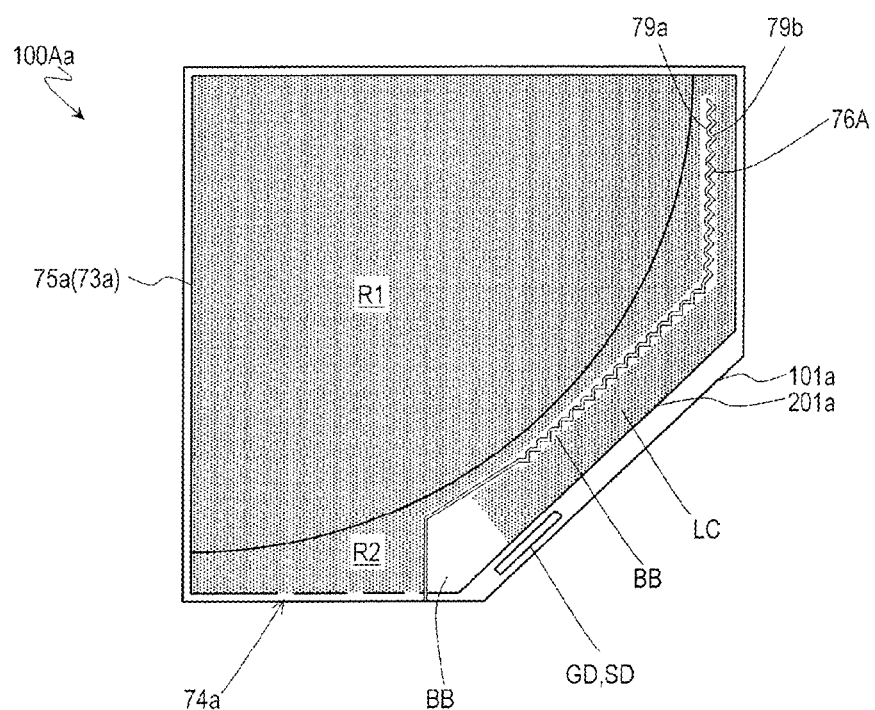
FIG. 6D is a schematic plan view of the liquid crystal panel 100Aa after a certain time period elapses from when the liquid crystal material is injected.

With reference to FIG. 6C and FIG. 6D, movement of the liquid crystal material after forming the liquid crystal layer will be described. FIG. 6C is a schematic plan view of the liquid crystal panel 100Aa immediately after the liquid crystal material is injected, and FIG. 6D is a schematic plan view of the liquid crystal panel 100Aa after a certain time period elapses from when the liquid crystal material is injected. In FIG. 6C and FIG. 6D, a region including the liquid crystal material in the region surrounded by the seal portion 73a is hatched. A region not including the liquid crystal material in the region surrounded by the seal portion 73a is the vacuum bubble (vacuum region) BB. As illustrated in FIG. 6C and FIG. 6D, as the time elapses from when the liquid crystal layer LC including the vacuum bubble is formed, the probability that the vacuum bubble is located near the additional seal portion 76A increases. As illustrated in FIG. 6C, immediately after the liquid crystal material is injected (that is, immediately after the liquid crystal layer LC is formed), the liquid crystal material is filled in order from the region closer to the injection port 74a, and the vacuum bubble (vacuum region) BB is generated in a region remote from the injection port 74a. As the time elapses from the state of FIG. 6C, the liquid crystal material moves, which causes a vacuum bubble (vacuum region) BB to be formed also around the additional seal portion 76A as illustrated in FIG. 6D to decrease the vacuum bubble (vacuum region) BB formed in the region remote from the injection port 74a in FIG. 6C. This is because the liquid crystal material moves to be present in a flat region (the region where the distance between the TFT substrate and the slot substrate is constant) as much as possible.

The movement of the liquid crystal material (i.e., transitioning from the state of FIG. 6C to the state of FIG. 6D) is accelerated by increasing the temperature of the liquid crystal layer. For example, it takes about a week at a room temperature, while only a few hours at about 80° C. As the temperature of the liquid crystal layer increases, a viscosity of the liquid crystal material decreases, and the liquid crystal material tends to move. Accordingly, after injecting the liquid crystal material, a process for increasing the temperature of the liquid crystal layer to, for example, 80° C. or higher may be performed. After the liquid crystal material moves, the temperature of the liquid crystal layer may be decreased to the room temperature, for example.

As descried above, since a vacuum bubble is easily formed around the additional seal portion 76A (that is, in the non-transmission and/or reception region R2), it is possible to suppress the formation of a vacuum bubble in the transmission and/or reception region R1. Thus, for example, by suppressing the formation of a vacuum bubble in the transmission and/or reception region R1 at a room temperature, the decrease in the antenna performance can be suppressed. In a case where the temperature of the liquid crystal layer changes from a room temperature, the decrease in the antenna performance can be suppressed by suppressing the change in the thickness of the liquid crystal layer by that the vacuum bubble absorbs the change in the volume of liquid crystal material.

In the process for forming the liquid crystal layer LC, a vacuum bubble (vacuum region) BB can be formed in the liquid crystal layer LC (that is, the region between the TFT substrate 101a and the slot substrate 201a, and surrounded by the seal portion 73a) by adjusting the supply amount of liquid crystal material. This causes the vacuum bubble to absorb the change in the volume of liquid crystal material to suppress the change in the thickness of the liquid crystal layer LC. In other words, the deflection of the dielectric substrate (for example, the glass substrate) included in the TFT substrate 101a and/or the slot substrate 201a is also suppressed. In the case where the liquid crystal material expands, the volume of vacuum bubble decreases, and in the case where the liquid crystal material shrinks, the volume of vacuum bubble increases. In particular, in the case where the liquid crystal material thermally expands, the deformation (deflection) of the TFT substrate 101a and the slot substrate 201a can be avoided as long as the vacuum bubble remains, so the thickness of the liquid crystal layer LC can be thought to not change as long as the vacuum bubble remains.

The liquid crystal layer may be formed by vacuum injection or may be formed by one drop filling. In the case where the vacuum injection is used, for example, the supply of the liquid crystal material may be stopped in a state in which a vacuum region is present between the TFT substrate and the slot substrate, and in the region surrounded by the seal portion. In a case where the one drop filling is used, for example, an amount of liquid crystal material smaller than a volume required to fill the entire region surrounded by the seal portion may be added dropwise. In the case where the one drop filling is used, the liquid crystal material may be preferentially added dropwise to the transmission and/or reception region R1.

Since the scanning antenna according to the present embodiment includes the additional seal portion 76A in the region surrounded by the seal portion 73a in the non-transmission and/or reception region R2, the effect can be obtained that in the case where the liquid crystal material thermally shrinks, the generation of a vacuum bubble (low-temperature air bubble) around the columnar spacer PS in the transmission and/or reception region R1 can be suppressed. Thus, the decrease in the antenna performance caused by the vacuum bubble (low-temperature air bubble) can be suppressed. As described above, in the case where the liquid crystal material thermally shrinks, the columnar spacer does not follow the decrease in the volume of liquid crystal material due to thermal shrinkage, and thus, a vacuum bubble (low-temperature air bubble) may be generated around the columnar spacer. When a vacuum bubble is generated in the liquid crystal layer LC (in particular, the liquid crystal layer LC in the vicinity of the patch electrode 15 and the slot 57) in the transmission and/or reception region R1, the antenna performance is likely to be affected by the change in the electrostatic capacitance value of the liquid crystal capacitance. Here, the low-temperature air bubble upon the temperature decreasing is first generated around the spacer defining the largest cell gap. As such, in the scanning antenna according to the present embodiment, since the additional seal portion 76A is included in the non-transmission and/or reception region R2, and the gap between the first dielectric substrate 1 and the second dielectric substrate 51 defined by the additional seal portion 76A is wider than the gap between the first dielectric substrate 1 and the second dielectric substrate 51 in the transmission and/or reception region R1, a low-temperature air bubble can be preferentially generated around the additional seal portion 76A (that is, non-transmission and/or reception region R2) to suppress the generation of a low-temperature air bubble around the columnar spacer PS in the transmission and/or reception region R1. Thus, the reduction in the antenna performance is suppressed.

In the process for forming the liquid crystal layer, after the liquid crystal material is injected, the temperature of the liquid crystal layer is increased to, for example, 120° C. or higher (or, for example, a Tni point or higher), and thereafter, decreased, so that the position of the vacuum bubble (vacuum region) formed in the liquid crystal layer can be controlled with higher accuracy. In other words, in a case where the liquid crystal layer is heated, as the volume of liquid crystal material increases, the volume of vacuum bubble (vacuum region) is reduced, as described above. For example, in a case where the temperature of the liquid crystal layer is increased to such an extent that the vacuum bubble (vacuum region) disappears, and thereafter, the temperature is decreased, the vacuum bubble begins to be generated from around the additional seal portion 76A having the largest cell gap as described above.

Note that FIG. 6C and FIG. 6D described above schematically illustrate the movement of the liquid crystal material, and in fact, even after a certain time period elapses from when the liquid crystal layer is formed, the entire vacuum bubbles may not be positioned in the non-transmission and/or reception region R2 as illustrated in FIG. 6D. In such a case as well, as described above, by increasing the temperature of the liquid crystal layer to the extent that the vacuum bubble temporarily disappears, the position of the vacuum bubble can be controlled with higher accuracy.

The additional seal portion 76A includes, for example, a granular spacer having a particle diameter greater than a particle diameter of the granular spacer included in the seal portion 73a. The gap between the first dielectric substrate 1 and the second dielectric substrate 51 defined by the seal portion 73a is typically the same as the gap between the first dielectric substrate 1 and the second dielectric substrate 51 in the transmission and/or reception region R1. In this case, since the additional seal portion 76A includes the granular spacer having the particle diameter greater than the particle diameter of the granular spacer included in the seal portion 73a, the additional seal portion 76A can define a gap between the first dielectric substrate 1 and the second dielectric substrate 51 that is larger than the gap between the first dielectric substrate 1 and the second dielectric substrate 51 in the transmission and/or reception region R1.

The additional seal portion 76A may have a spacer structure that defines a gap between the first dielectric substrate 1 and the second dielectric substrate 51 that is larger than the gap between the first dielectric substrate 1 and the second dielectric substrate 51 in the transmission and/or reception region R1 (also referred to as a "first gap"). Herein, the "spacer structure" includes all of the conductive layers, insulating layers, and spacers (columnar spacers or granular spacers) included between the first dielectric substrate 1 and the second dielectric substrate 51. The spacer structure that defines the first gap disposed in the transmission and/or reception region R1 may be referred to as a first spacer structure. In the illustrated example, the first spacer structure includes the columnar spacer PS. The first spacer structure typically includes a columnar spacer defining the thickness of the liquid crystal layer LC between the patch electrode 15 and the slot electrode 55. In the scanning antenna according to the embodiment of the disclosure, the additional seal portion may include a second spacer structure higher than the first spacer structure. Assuming that a height of the first spacer structure defining the first gap is 1, a height of the second spacer structure is preferably 1.1 or more and 2.0 or less, for example. A difference between the height of the first spacer structure and the height of the second spacer structure is, for example, 0.9 μm or more 3 μm or less. The second spacer structure being too high compared to the first spacer structure may affect the thickness of the liquid crystal layer LC in the transmission and/or reception region R1.

From the perspective that a vacuum bubble is made to be easily formed along the side face of the additional seal portion 76A, when viewed from the normal direction of the first dielectric substrate 1, a pitch of the plurality of recessed portions or the plurality of protruding portions included in the first main side face 79a and the second main side face 79b of the additional seal portion 76A is preferably, for example, from 2 mm to 100 mm. In the illustrated example, when viewed from the normal direction of the first dielectric substrate 1, each of the first main side face 79a and the second main side face 79b of the additional seal portion 76A can be said to dependently include a plurality of recessed portions or a plurality of protruding portions. A width of each recessed portion and a width of each protruding portion are approximately equal to each other, and the pitch of the plurality of recessed portions (or the pitch of the plurality of protruding portions) is a sum of the width of the single recessed portion and the width of the single protruding portion. In the illustrated example, when viewed from the normal direction of the first dielectric substrate 1, each of the recessed portions and protruding portions included in the first main side face 79a and the second main side face 79b of the additional seal portion 76A is substantially triangular. However, the shape of the additional seal portion is not limited to that illustrated, and when viewed from the normal direction of the first dielectric substrate 1, each of the recessed portion and/or the protruding portion included in the first main side face and the second main side face of the additional seal portion may be rectangular, semicircular, semi-elliptical, or the like. When viewed from the normal direction of the first dielectric substrate 1, the first main side face and the second main side face of the additional seal portion may include a plurality of protruding portions (or recessed portions) having shapes different from each other, or may include a repeated structure of protruding portions (or recessed portions) having the same shape. In the illustrated example, when viewed from the normal direction of the first dielectric substrate 1, the first main side face 79a and the second main side face 79b are substantially parallel to each other. The additional seal portion may be separated into a plurality of portions, but in a case where the additional seal portion is in a continuous line shape (including linear and curved line shape) when viewed from the normal direction of the first dielectric substrate 1 as in the illustrated example, the additional seal portion can be formed by drawing with a sealing member as described below, which is preferable in terms of mass productivity. As in the illustrated example, when viewed from the normal direction of the first dielectric substrate 1, one end of the additional seal portion 76A may contact the seal portion 73a.

Note that although the example is illustrated in which both the first main side face 79a and the second main side face 79b of the additional seal portion 76A includes a plurality of recessed portions and/or a plurality of protruding portions, however, the embodiments of the disclosure are not limited thereto. At least one of the first main side face and the second main side face of the additional seal portion may include a plurality of recessed portions and/or a plurality of protruding portions. In this case, the same effects as the scanning antenna having the additional seal portion 76A can be obtained.

The liquid crystal panel 100Aa is prepared as follows, for example. The liquid crystal panel 100Aa can be prepared in the same manner as the liquid crystal panel 100a except for the additional seal portion 76A.

A sealing member is used to draw a seal pattern for forming the seal portion 73a on one of the slot substrate 201a and the TFT substrate 101a, similar to the liquid crystal panel 100a. At this time, the sealing member is used to draw a pattern for forming the additional seal portion 76A on one of the slot substrate 201a and the TFT substrate 101a (typically, the same as the substrate on which the seal pattern for forming the seal portion 73a) using, for example, a dispenser. The sealing member for forming the additional seal portion 76A includes, for example, a granular spacer having a particle diameter greater than a particle diameter of the granular spacer included in the sealing member for forming the seal portion 73a.

After that, one and the other of the above substrates are overlaid on one another, and heated for a predetermined time at a predetermined temperature with a pressure being applied to cure the sealing member.

Next, the liquid crystal layer LC is formed by the method described above. Specifically, the liquid crystal material is supplied to generate a vacuum bubble within the region between the TFT substrate 101a and the slot substrate 201a, and surrounded by the seal portion 73a. For example, the liquid crystal material may be injected from the injection port 74a by vacuum injection, or the liquid crystal layer LC may be formed by one drop filling.

In the above, the example is described in which the additional seal portion 76A is formed using the sealing member, but the additional seal portion included in the scanning antenna according to the embodiment of the disclosure is not limited to those formed using a sealing member, and may be formed by a photolithography process, for example. For example, the additional seal portion may be formed using the same material as the columnar spacer PS (for example, an ultraviolet-curing resin), or may further include a different resin material. The additional seal portion can be formed in the same process for the columnar spacer PS.

The additional seal portion may be referred to as a "wall structure" in order to clarify that the additional seal portion is not limited to those formed using a sealing member. The matter described herein as the additional seal portion applies to the wall structure. As described above as the additional seal portion, the wall structure may include the following structures (1) and (2). (1) The wall structure includes a spacer structure that defines a gap between the first dielectric substrate 1 and the second dielectric substrate 51 in the non-transmission and/or reception region R2, the gap being larger than the first gap (that is the gap between the first dielectric substrate 1 and the second dielectric substrate 51 in the transmission and/or reception region R1). (2) The wall structure includes the first main side face and the second main side face that intersect the surface of the first dielectric substrate 1, and at least one of the first main side face and the second main side face includes a plurality of recessed portions and/or a plurality of protruding portions when viewed from the normal direction of the first dielectric substrate 1.

MODIFICATION EXAMPLE

Figure 7A:
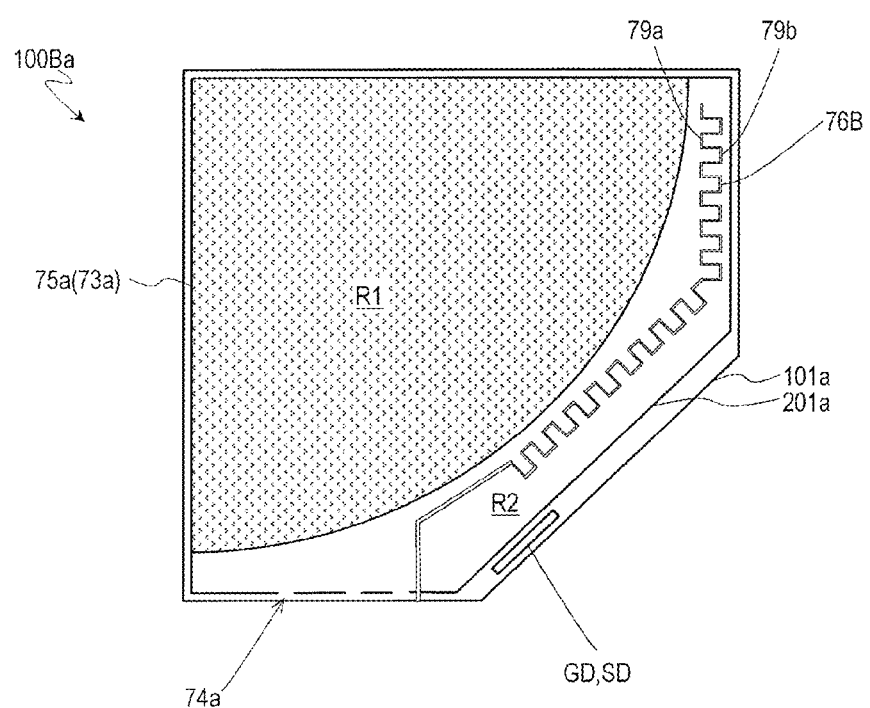
FIG. 7A is a schematic plan view of one liquid crystal panel 100Ba for preparing a liquid crystal panel of a scanning antenna according to a modification example of the embodiment of the disclosure by tiling four liquid crystal panels.
Figure 7B:
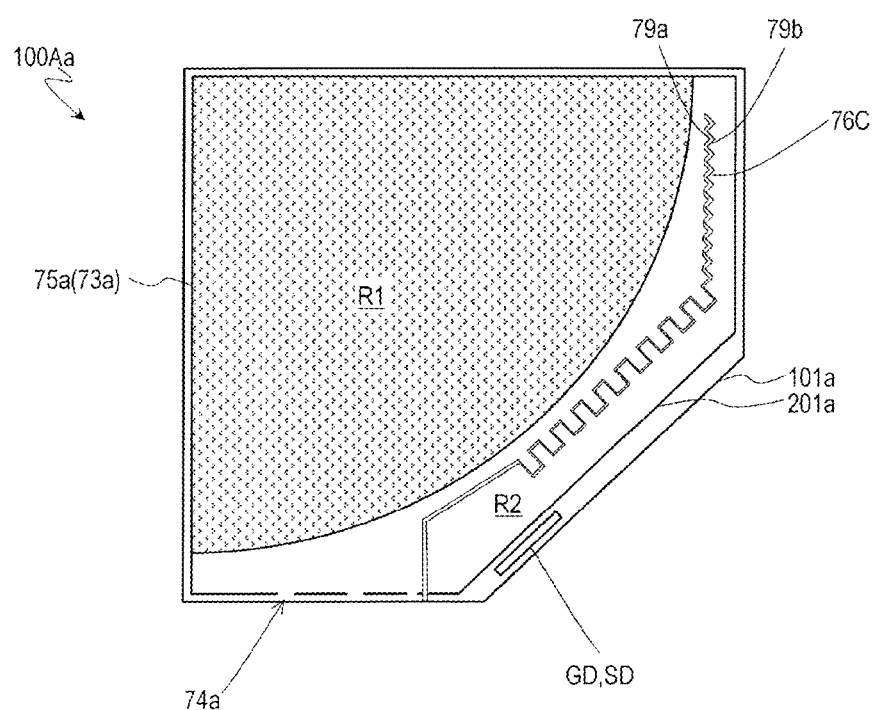
FIG. 7B is a schematic plan view of one liquid crystal panel 100Ca for preparing a liquid crystal panel of a scanning antenna according to another modification example of the embodiment of the disclosure by tiling four liquid crystal panels.

A description is given of a modification example of the additional seal portion with reference to FIG. 7A and FIG. 7B. FIG. 7A and FIG. 7B are schematic plan views of one liquid crystal panel 100Ba and one liquid crystal panel 100Ca, respectively, for preparing a liquid crystal panel of a scanning antenna according to the modification example of the embodiment of the disclosure by tiling four liquid crystal panels. In FIG. 7A and FIG. 7B, the transmission and/or reception region R1 is hatched similar to FIG. 6A.

As illustrated in FIG. 7A, when viewed from the normal direction of the first dielectric substrate 1, a plurality of recessed portions and/or a plurality of protruding portions included in the first main side face 79a and the second main side face 79b of an additional seal portion 76B included in the liquid crystal panel 100Ba are rectangular.

As illustrated in FIG. 7B, when viewed from the normal direction of the first dielectric substrate 1, a plurality of recessed portions and/or a plurality of protruding portions included in the first main side face 79a and the second main side face 79b of an additional seal portion 76C included in the liquid crystal panel 100Ca include rectangular recessed portions or protruding portions, and triangular recessed portions or protruding portions.

According to the scanning antenna prepared using the liquid crystal panel 100Ba or liquid crystal panel 100Ca having the structure as described above, the same effects as the scanning antenna prepared using the liquid crystal panel 100Aa can also be obtained.

A description is given of further other modification examples of the additional seal portion with reference to FIG. 7C, FIG. 7D, FIG. 7E and FIG. 7F. FIGS. 7C, FIG. 7D, FIG. 7E and FIG. 7F are schematic plan views, when viewed from the normal direction of the first dielectric substrate 1, illustrating portions of the first main side faces 79a of additional seal portions 76D, 76E, 76F, and 76G, respectively, that may be included in the scanning antenna according to the embodiment of the disclosure. The following examples may or may not be applied to the second main side face. Of course, a plurality of any of the illustrated embodiments may be combined. The additional seal portion included in the scanning antenna according to the embodiment of the disclosure is not limited to those illustrated, and may be modified as appropriate.

Figure 7C:
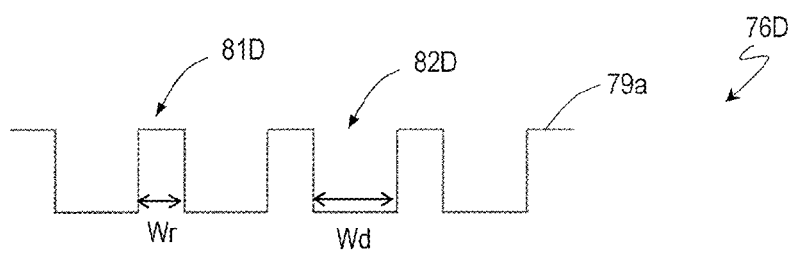
FIG. 7C is a schematic plan view illustrating a portion of a first main side face 79a of an additional seal portion 76D when viewed from a normal direction of a first dielectric substrate 1.

As illustrated in FIG. 7C, when viewed from the normal direction of the first dielectric substrate 1, the first main side face 79a of the additional seal portion 76D can be said to include a plurality of protruding portions 81D or a plurality of recessed portions 82D. A width Wr of the protruding portion 81D and a width Wd of the recessed portion 82D differ from each other. A pitch of the plurality of protruding portions 81D (or a pitch of the plurality of recessed portions 82D) is a sum of the width Wr of the protruding portion 81D and the width Wd of the recessed portion 82D (Wr+Wd).

Figure 7D:
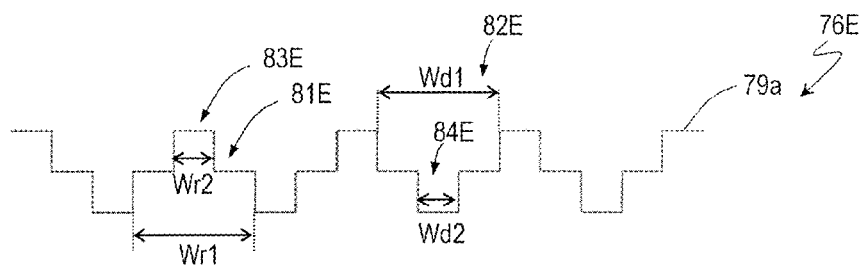
FIG. 7D is a schematic plan view illustrating a portion of a first main side face 79a of an additional seal portion 76E when viewed from the normal direction of the first dielectric substrate 1.

As illustrated in FIG. 7D, when viewed from the normal direction of the first dielectric substrate 1, the first main side face 79a of the additional seal portion 76E can be said to include a plurality of protruding portions 81E or a plurality of recessed portions 82E. When viewed from the normal direction of the first dielectric substrate 1, the first main side face 79a of the additional seal portion 76E further includes a second protruding portion 83E formed to overlap each protruding portion 81E (also referred to as a "first protruding portion 81E"), or a second recessed portion 84E formed to overlap each recessed portion 82E (also referred to as a "first recessed portion 82E"). In this example, a pitch of the plurality of protruding portions 81E (or a pitch of the plurality of recessed portions 82E) is a sum of a width Wr1 of the first protruding portion 81E and a width Wd2 of the second recessed portion 84E (Wr1+Wd2), or a sum of a width Wd1 of the first recessed portion 82E and a width Wr2 of the second protruding portion 83E (Wd1+Wr2).

Figure 7E:
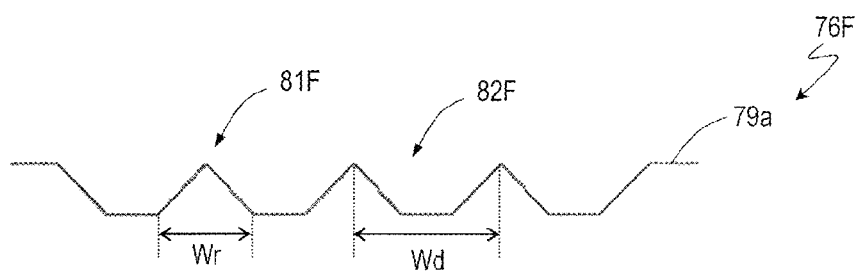
FIG. 7E is a schematic plan view illustrating a portion of a first main side face 79a of an additional seal portion 76F when viewed from the normal direction of the first dielectric substrate 1.

As illustrated in FIG. 7E, when viewed from the normal direction of the first dielectric substrate 1, the first main side face 79a of the additional seal portion 76F can be said to include a plurality of protruding portions 81F or a plurality of recessed portions 82F. A shape of the protruding portion 81F and a shape of the recessed portion 82F differ from each other. In this example, a pitch of the plurality of protruding portions 81F (or a pitch of the plurality of recessed portions 82F) is a width Wd of the recessed portion 82F.

Figure 7F:
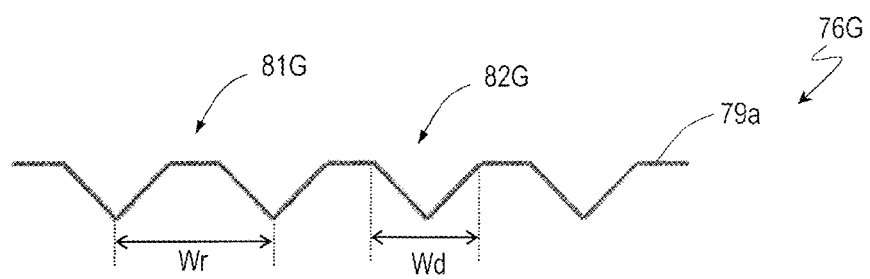
FIG. 7F is a schematic plan view illustrating a portion of a first main side face 79a of an additional seal portion 76G when viewed from the normal direction of the first dielectric substrate 1.

As illustrated in FIG. 7F, when viewed from the normal direction of the first dielectric substrate 1, the first main side face 79a of the additional seal portion 76G can be said to include a plurality of protruding portions 81G or a plurality of recessed portions 82G. A shape of the protruding portion 81G and a shape of the recessed portion 82G differ from each other. In this example, a pitch of the plurality of protruding portions 81G (or a pitch of the plurality of recessed portions 82G) is a width Wr of the protruding portion 81G.

Structure of TFT Substrate 101

Figure 8:
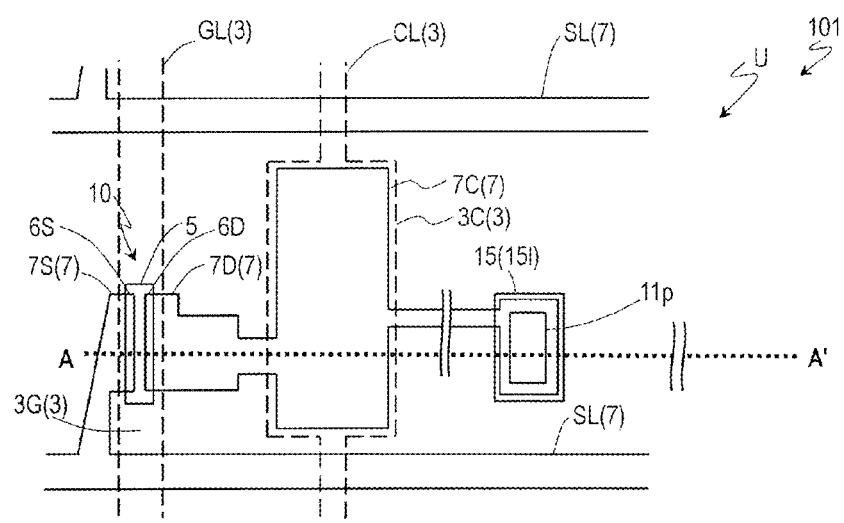
FIG. 8 is a schematic plan view illustrating an antenna unit region U of the TFT substrate 101.
Figure 9A:
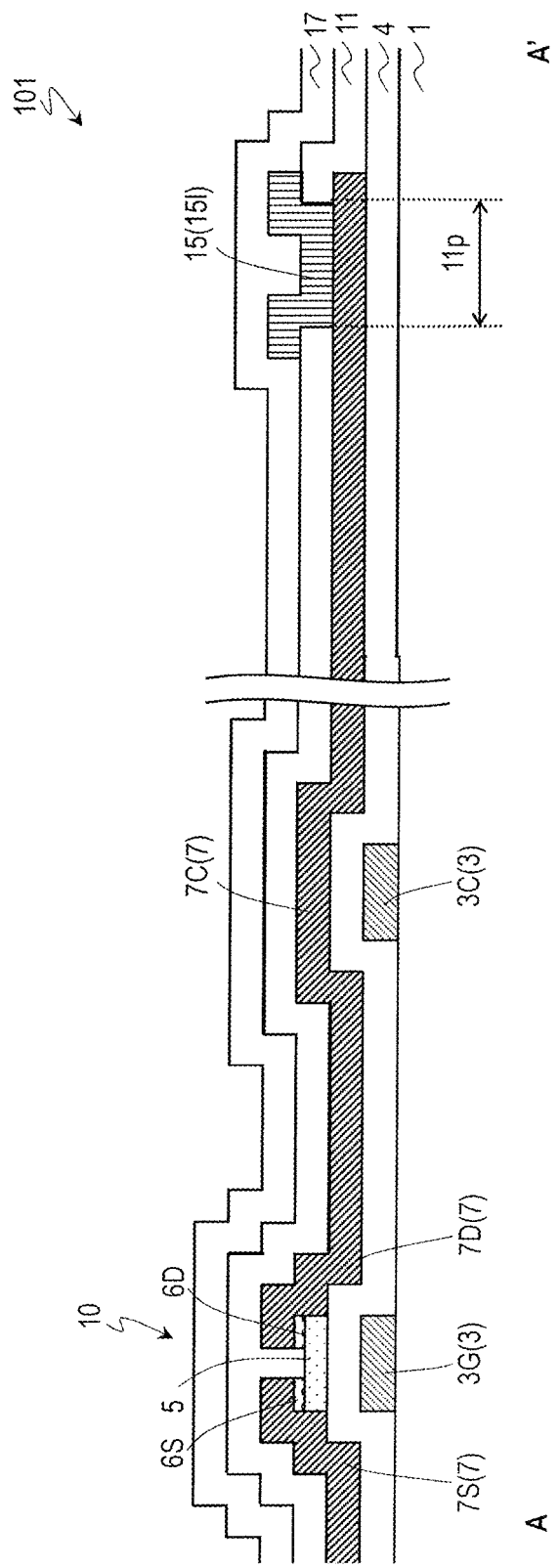
FIG. 9A is a schematic cross-sectional view illustrating the antenna unit region U of the TFT substrate 101.
Figure 9B:
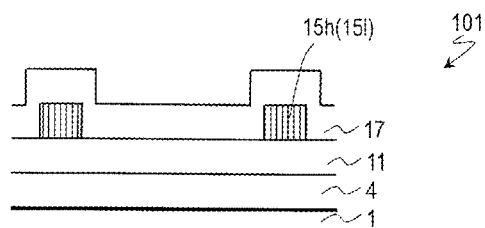
FIG. 9B is a schematic cross-sectional view illustrating a region including a columnar spacer PS in a non-transmission and/or reception region R2 of the TFT substrate 101.

A description is given of a structure of the TFT substrate 101 with reference to FIG. 8, FIG. 9A, and FIG. 9B. FIG. 8 is a schematic plan view illustrating the antenna unit region U of the TFT substrate 101, and FIG. 9A is a schematic cross-sectional view illustrating the antenna unit region U of the TFT substrate 101, and illustrates a cross section taken along a line A-A' in FIG. 8. FIG. 9B is a schematic cross-sectional view illustrating a region including the columnar spacer PS in the non-transmission and/or reception region R2 of the TFT substrate 101.

Note that the structure of the TFT substrate included in the scanning antenna according to the embodiment of the disclosure is not limited to those illustrated.

As illustrated in FIG. 8, FIG. 9A, and FIG. 9B, the TFT substrate 101 includes the dielectric substrate 1 and a plurality of antenna unit regions U arranged on the dielectric substrate 1. Each of the antenna unit regions U includes the TFT 10 and the patch electrode 15 electrically connected to a drain electrode 7D of the TFT 10.

The TFT substrate 101 includes a gate metal layer 3 supported by the dielectric substrate 1, a gate insulating layer 4 formed on the gate metal layer 3, a source metal layer 7 formed on the gate insulating layer 4, a first insulating layer 11 formed on the source metal layer 7, a patch metal layer 15l formed on the first insulating layer 11, and a second insulating layer 17 formed on the patch metal layer 15l. Here, the TFT substrate 101 further includes an upper conductive layer 19 formed on the second insulating layer 17, as in a structure of the non-transmission and/or reception region R2 illustrated in FIG. 10A, FIG. 10B, and FIG. 10C described below.

The TFT 10 included in each antenna unit region U includes a gate electrode 3G, an island-shaped semiconductor layer 5, contact layers 6S and 6D, the gate insulating layer 4 disposed between the gate electrode 3G and the semiconductor layer 5, and a source electrode 7S and the drain electrode 7D. In this example, the TFT 10 is a channel etched type TFT having a bottom gate structure.

The gate electrode 3G is electrically connected to the gate bus line GL, and a scanning signal is supplied via the gate bus line GL. The source electrode 7S is electrically connected to the source bus line SL, and a data signal is supplied via the source bus line SL. The gate electrode 3G and the gate bus line GL may be formed of the same conductive film (gate conductive film). The source electrode 7S, the drain electrode 7D, and the source bus line SL may be formed from the same conductive film (source conductive film). The gate conductive film and the source conductive film are, for example, metal films. Herein, layers formed using a gate conductive film may be referred to as "gate metal layers," and layers formed using a source conductive film may be referred to as "source metal layers." A layer including the patch electrode 15 may be referred to as a "patch metal layer."

The semiconductor layer 5 is disposed overlapping the gate electrode 3G with the gate insulating layer 4 interposed therebetween. In the illustrated example, a source contact layer 6S and a drain contact layer 6D are formed on the semiconductor layer 5. The source contact layer 6S and the drain contact layer 6D are disposed on both sides of a region where a channel is formed in the semiconductor layer 5 (channel region). In this example, the semiconductor layer 5 may be an intrinsic amorphous silicon (i-a-Si) layer, and the source contact layer 6S and the drain contact layer 6D may be $n^+$ type amorphous silicon ($n^+$-a-Si) layers.

The source electrode 7S is provided in contact with the source contact layer 6S and is connected to the semiconductor layer 5 with the source contact layer 6S interposed therebetween. The drain electrode 7D is provided in contact with the drain contact layer 6D and is connected to the semiconductor layer 5 with the drain contact layer 6D interposed therebetween.

The first insulating layer 11 includes an opening 11p that at least reaches a portion extending from the drain electrode 7D of the TFT 10.

The patch electrode 15 is provided on the first insulating layer 11 and within the opening 11p, and is in contact with the portion extending from the drain electrode 7D in the opening 11p. The patch electrode 15 includes a metal layer. The patch electrode 15 may be a metal electrode formed only from a metal layer. The patch electrode 15 may include a Cu layer or an Al layer as a main layer. A performance of the scanning antenna correlates with an electric resistance of the patch electrode 15, and a thickness of the main layer is set so as to obtain a desired resistance. In terms of the electric resistance, there is a possibility that the thickness of the patch electrode 15 can be made thinner in the Cu layer than in the Al layer.

Here, each antenna unit region U includes an auxiliary capacity electrically connected in parallel with the liquid crystal capacitance. The auxiliary capacity includes an upper auxiliary capacitance electrode 7C electrically connected to the drain electrode 7D, the gate insulating layer 4, and a lower auxiliary capacitance electrode 3C opposite to the upper auxiliary capacitance electrode 7C with the gate insulating layer 4 interposed therebetween. For example, the lower auxiliary capacitance electrode 3C is included in the gate metal layer 3 and the upper auxiliary capacitance electrode 7C is included in the source metal layer 7. The gate metal layer 3 may further include a CS bus line (auxiliary capacitance line) CL connected to the lower auxiliary capacitance electrode 3C.

Here, as illustrated in FIG. 9B, the TFT substrate 101 includes a protruding portion 15h that overlaps the columnar spacer PS (see FIG. 6B also). Here, the protruding portion 15h is formed from the same conductive film as the patch electrode 15 (that is, included in the patch metal layer 15l). By forming the columnar spacer PS on the protruding portion 15h, the height of the columnar spacer PS can be reduced. The protruding portion 15h may be formed from other conductive layers or may be omitted.

Figure 10A:
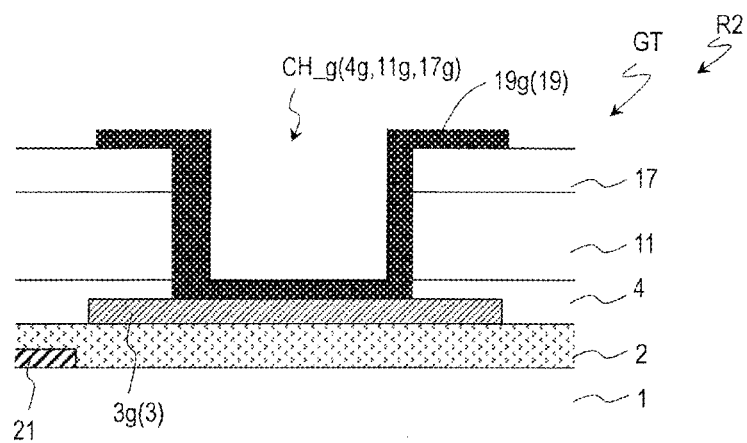
FIG. 10A is a schematic cross-sectional view of the non-transmission and/or reception region R2 of the TFT substrate 101.
Figure 10B:
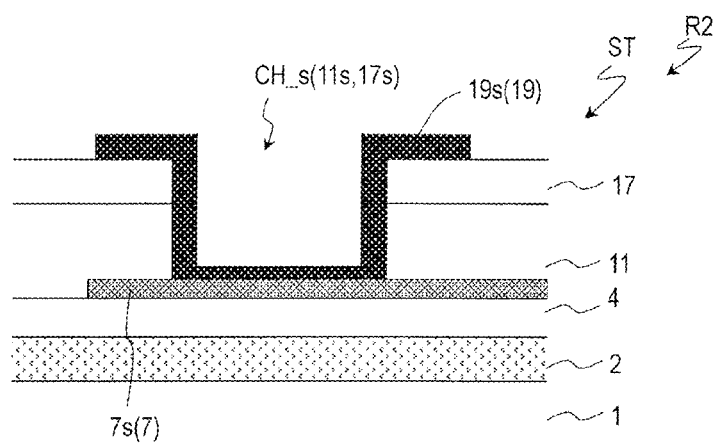
FIG. 10B is a schematic cross-sectional view of the non-transmission and/or reception region R2 of the TFT substrate 101.
Figure 10C:
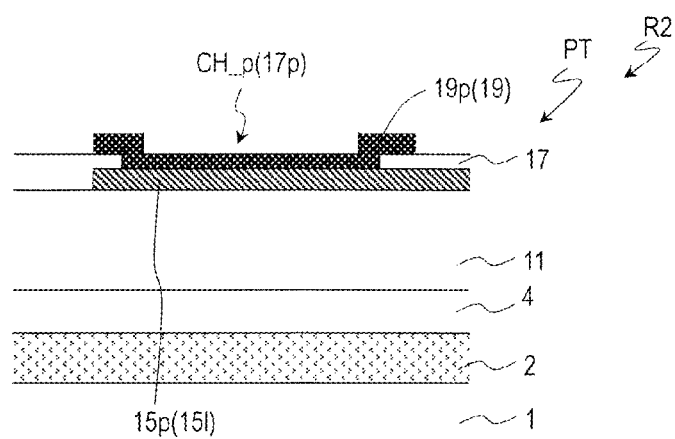
FIG. 10C is a schematic cross-sectional view of the non-transmission and/or reception region R2 of the TFT substrate 101.

FIG. 10A, FIG. 10B, and FIG. 10C illustrate schematic cross-sectional views of the non-transmission and/or reception region R2 of the TFT substrate 101. FIG. 10A, FIG. 10B, and FIG. 10C schematically illustrate the gate terminal section GT, the source terminal section ST, and the transfer terminal section PT, respectively. Note that in the cross-sectional view, for simplicity, an inorganic insulating layer may be represented as a flattened layer, but in general, a layer formed by a thin film deposition method (for example, CVD, sputtering, or vacuum vapor deposition technique) has a surface that reflects steps of an underlayer.

As illustrated in FIG. 10A, the gate terminal section GT includes a gate terminal lower connection section 3g (also simply referred to as a "lower connection section 3g") electrically connected to the gate bus line GL, a contact hole CH_g formed in the gate insulating layer 4, the first insulating layer 11, and the second insulating layer 17, and a gate terminal upper connection section 19g (also simply referred to as an "upper connection section 19g").

The lower connection section 3g is included in the gate metal layer 3 in this example. The lower connection section 3g may be formed integrally with the gate bus line GL, for example.

The contact hole CH_g formed in the gate insulating layer 4, the first insulating layer 11, and the second insulating layer 17 at least reaches the lower connection section 3g. The contact hole CH_g includes an opening 4g formed in the gate insulating layer 4, an opening 11g formed in the first insulating layer 11, and an opening 17g formed in the second insulating layer 17.

The upper connection section 19g is included in the upper conductive layer 19. The upper connection section 19p is connected to the lower connection section 3g within the contact hole CH_g formed in the gate insulating layer 4, the first insulating layer 11, and the second insulating layer 17.

As illustrated in FIG. 10B, the source terminal section ST includes a source terminal lower connection section 7s (also simply referred to as a "lower connection section 7s") electrically connected to the source bus line, a contact hole CH_s formed in the first insulating layer 11 and the second insulating layer 17, and a source terminal upper connection section 19s (also simply referred to as an "upper connection section 19s").

The lower connection section 7s is included in the source metal layer 7 in this example. The lower connection section 7s may be formed integrally with the source bus line SL, for example. However, the source terminal lower connection section is not limited to the illustrated example and may be formed of the gate metal layer 3. In this case, the cross-sectional structure of the source terminal section may be the same as the cross-sectional structure of the gate terminal section GT.

The contact hole CH_s formed in the first insulating layer 11 and the second insulating layer 17 at least reaches the lower connection section 7s.

The upper connection section 19s is included in the upper conductive layer 19. The upper connection section 19s is connected to the lower connection section 7s within the contact hole CH_s formed in the first insulating layer 11 and the second insulating layer 17.

The transfer terminal section PT includes a transfer terminal lower connection section 15p (also simply referred to as a "lower connection section 15p"), a contact hole CH_p (opening 17p) formed in the second insulating layer 17, and a transfer terminal upper connection section 19p (also simply referred to as an "upper connection section 19p") as illustrated in FIG. 10C.

The lower connection section 15p is included in the patch metal layer 15l in this example.

The opening 17p formed in the second insulating layer 17 at least reaches the lower connection section 15p. The opening 17p may be referred to as the contact hole CH_p.

The upper connection section 19p is included in the upper conductive layer 19. The upper connection section 19p is connected to the lower connection section 15p within the contact hole CH_p formed in the second insulating layer 17.

The TFT substrate 101 may further include an alignment mark (for example, a metal layer) 21 and a base insulating layer 2 covering the alignment mark 21 on a side closer to the dielectric substrate 1 than the gate metal layer 3, as illustrated in FIG. 10A. The alignment mark 21 is used as follows. In a case of preparing m TFT substrates from one glass substrate and of the number of photomasks being n (where n<m), it is necessary to perform each exposure process by dividing the process into multiple processes. In this way, when the number (n) of photomasks is less than the number (m) of TFT substrates prepared from one glass substrate, the alignment mark 21 is used for alignment of the photomasks. The alignment mark 21 and the base insulating layer 2 may be omitted. In FIG. 10, illustration of the alignment marks 21 and the base insulating layer 2 is omitted.

Note that the shape and position of the alignment mark is not limited to the illustrated example. For example, the alignment mark may be formed of the gate metal layer 3. In this case, a manufacturing cost (for example, the number of photomasks) can be reduced as compared to a case where the alignment mark is formed of the metal layer closer to the dielectric substrate 1 than the gate metal layer 3 (for example, see FIG. 10A). In this case, the base insulating layer 2 may be omitted.

Manufacturing Method of TFT Substrate 101

A description is given of a manufacturing method of the TFT substrate 101.

First, a metal film (for example, a Ti film, a Mo film, a Ta film, an Al film, or a Cu film) is formed on the dielectric substrate 1 and patterned to form the alignment mark 21. A glass substrate, a plastic substrate (resin substrate) having heat resistance, or the like can be used as the dielectric substrate 1, for example. Next, the base insulating layer 2 is formed to cover the alignment mark 21. Here, as the base insulating layer 2, a silicon oxide ($SiO_x$) or silicon nitride ($Si_xN_y$) film, for example. Note that in the case where the alignment mark is formed of the gate metal layer 3, the process for forming the alignment mark 21 and the base insulating layer 2 is omitted. In this case, in the process for patterning the gate conductive film described below, an alignment mark may be formed.

Subsequently, a gate conductive film is formed on the dielectric substrate 1 by sputtering or the like. A material of the gate conductive film is not particularly limited, and, for example, a film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used. Here, as the gate conductive film, a layered film (MoN/Al) is formed by layering an Al film (having a thickness of 150 nm, for example) and a MoN film (having a thickness of 100 nm, for example) in this order. Alternatively, as the gate conductive film, a layered film (Cu/Ti) may be formed by layering a Ti film (having a thickness of 20 nm, for example) and a Cu film (having a thickness of 200 nm, for example) in this order.

Next, the gate conductive film is patterned to form the gate metal layer 3. Specifically, the gate electrode 3G of the TFT 10, the gate bus line GL, and the lower auxiliary capacitance electrode 3C are formed in the antenna unit formation region, and the lower connection section 3g is formed in the gate terminal section formation region. Patterning of the gate conductive film is performed by, for example, wet etching (wet-type etching) and/or dry etching (dry-type etching).

After that, a gate insulating film, an intrinsic amorphous silicon film, and an n+ type amorphous silicon film are formed in this order to cover the gate metal layer 3. The gate insulating film can be formed by CVD or the like. For the gate insulating film, a silicon oxide ($SiO_x$) film, a silicon nitride ($Si_xN_y$) film, a silicon oxynitride ($SiO_xN_y$; x>y) film, a silicon nitride oxide ($SiN_xO_y$; x>y) film, or the like can be used as appropriate. Here, as the gate insulating film, a silicon nitride ($Si_xN_y$) film having a thickness of 350 nm, for example, is deposited. An intrinsic amorphous silicon film having a thickness of 120 nm, for example, and an n+ type amorphous silicon film having a thickness of 30 nm, for example, are further formed on the gate insulating film.

Next, the intrinsic amorphous silicon film and the n+ type amorphous silicon film are patterned to obtain the island-shaped semiconductor layer 5 and a contact portion. Note that the semiconductor film used for the semiconductor layer 5 is not limited to an amorphous silicon film. For example, an oxide semiconductor layer may be formed as the semiconductor layer 5. In this case, it is not necessary to provide a contact layer between the semiconductor layer 5, and the source electrode and drain electrode.

Next, a source conductive film is formed on the gate insulating film and on the contact portion by sputtering or the like. A material of the source conductive film is not particularly limited, and, for example, a film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used. Here, as the source conductive film, a layered film (MoN/Al/MoN) is formed by layering MoN (having a thickness of 50 nm, for example), Al (having a thickness of 150 nm, for example), and MoN (having a thickness of 100 nm, for example) in this order. Alternatively, as the source conductive film, a layered film (Cu/Ti) may be formed by layering Ti (having a thickness of 20 nm, for example) and Cu (having a thickness of 200 nm, for example) in this order.

Next, the source conductive film is patterned to form the source metal layer 7. At this time, the contact portion is also etched, and the source contact layer 6S and the drain contact layer 6D are formed to be separated from each other. Specifically, the source electrode 7S and the drain electrode 7D of the TFT 10, the source bus line SL, and the upper auxiliary capacitance electrode 7C are formed in the antenna unit formation region, and the lower connection section 7s is formed in the source terminal section formation region.

Patterning of the source conductive film is performed by, for example, wet etching (wet-type etching) and/or dry etching (dry-type etching). In a case where the layered film is formed as the source conductive film by layering a MoN film, an Al film, and a MoN film in this order, the MoN film and the Al film are simultaneously patterned by wet etching, for example. In the case where the layered film is formed as the source conductive film by layering a Ti film and a Cu film in this order, the Ti film and the Cu film can be patterned by wet etching, for example. After that, a portion of the contact layer located on the region that will serve as the channel region of the semiconductor layer 5 is removed by dry etching, for example, to form a gap portion, and the source contact layer 6S and the drain contact layer 6D are separated. At this time, in the gap portion, the area around the surface of the semiconductor layer 5 is also etched (overetching). In this manner, the TFT 10 is obtained.

Next, a first insulating film is formed to cover the TFT 10 and the source metal layer 7 by CVD, for example. For the first insulating film, a silicon oxide ($SiO_x$) film, a silicon nitride ($Si_xN_y$) film, a silicon oxynitride ($SiO_xN_y$; x>y) film, a silicon nitride oxide ($SiN_xO_y$; x>y) film, or the like can be used as appropriate. In this example, the first insulating film is formed to be in contact with the channel region of the semiconductor layer 5. Here, as the first insulating film, a silicon nitride ($Si_xN_y$) film having a thickness of 330 nm, for example, is deposited.

Subsequently, the first insulating film is etched by a known photolithography process to form the opening 11p that at least reaches a portion extending from the drain electrode.

Next, a patch conductive film is formed on the first insulating film and within the opening 11p by sputtering or the like. The same material as that of the gate conductive film or the source conductive film can be used as the material of the patch conductive film. The patch conductive film may be configured to be thicker than the gate conductive film and the source conductive film. Accordingly, by reducing the sheet resistance of the patch electrode, the loss resulting from the oscillation of free electrons in the patch electrode changing to heat can be reduced. Here, a layered film (Cu/Ti) is formed by layering Ti (having a thickness of 50 nm, for example) and Cu (having a thickness of 600 nm, for example) in this order.

Next, the patch conductive film is patterned to form the patch metal layer 15l. Specifically, the patch electrode 15 is formed in the antenna unit formation region, the protruding portion 15h is formed in the columnar spacer PS formation region, and the lower connection section 15p is formed in the transfer terminal section formation region. Patterning of the patch conductive film is performed by, for example, wet etching (wet-type etching) and/or dry etching (dry-type etching).

Next, a second insulating film is formed on the patch metal layer 15l and on the first insulating film by CVD, for example. For the second insulating film, a silicon oxide ($SiO_x$) film, a silicon nitride ($Si_xN_y$) film, a silicon oxynitride ($SiO_xN_y$; x>y) film, a silicon nitride oxide ($SiN_xO_y$; x>y) film, or the like can be used as appropriate. Here, as the second insulating film, a silicon nitride ($Si_xN_y$) film having a thickness of 130 nm, for example, is deposited.

Next, the gate insulating film, the first insulating film, and the second insulating film are etched through a known photolithography process to form the gate insulating layer 4, the first insulating layer 11, and the second insulating layer 17. Specifically, the contact hole CH_g that at least reaches the lower connection section 3g of the gate terminal section formation region is formed in the gate insulating film, the first insulating film, and the second insulating film, the contact hole CH_s that at least reaches the lower connection section 7s of the source terminal section formation region is formed in the first insulating film and the second insulating film, and the contact hole CH_p that at least reaches the lower connection section 15p of the transfer terminal section formation region is formed in the second insulating film. Here, the gate insulating film, the first insulating film, and the second insulating film are simultaneously etched by dry etching using a fluorine gas.

Next, an upper conductive film including a transparent conductive film is formed on the second insulating layer 17, within the contact hole CH_g, within the contact hole CH_s, and within the contact hole CH_p by sputtering, for example. An indium tin oxide (ITO) film, an IZO film, a zinc oxide (ZnO) film or the like can be used as the transparent conductive film. Here, as the upper conductive film, a layered film (ITO/Ti) is used which is formed by layering Ti (having a thickness of 50 nm, for example) and ITO (having a thickness of 70 nm, for example) in this order.

Next, the upper conductive film is patterned to form the upper conductive layer 19. Specifically, the upper connection section 19g in the gate terminal section formation region, the upper connection section 19s in the source terminal section formation region, and the upper connection section 19p in the transfer terminal section formation region are formed.

In this manner, the TFT substrate 101 is manufactured.

Structure of Slot Substrate 201

Figure 11:
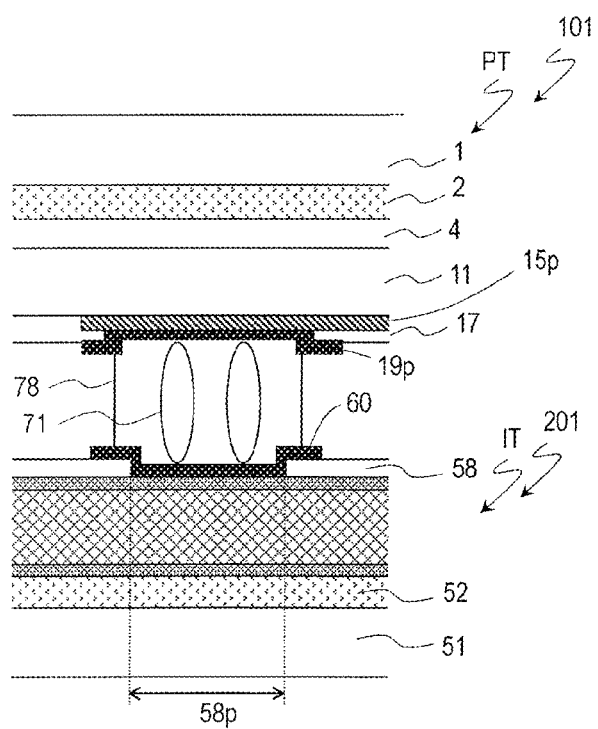
FIG. 11 is a schematic cross-sectional view for illustrating a transfer section connecting a transfer terminal section PT of the TFT substrate 101 to a terminal section IT of a slot substrate 201A.

Referring to FIG. 6B and FIG. 11, a structure of the slot substrate 201 will be described in more detail. FIG. 11 is a schematic cross-sectional view for illustrating the transfer section connecting the transfer terminal section PT of the TFT substrate 101 to the terminal section IT of the slot substrate 201.

The slot substrate 201 includes the dielectric substrate 51 including a front face and a rear face, a third insulating layer 52 formed on the front face of the dielectric substrate 51, the slot electrode 55 formed on the third insulating layer 52, and a fourth insulating layer 58 covering the slot electrode 55. The reflective conductive plate 65 (see FIG. 1) is disposed opposing the rear face of the dielectric substrate 51 with the dielectric layer (air layer) 54 interposed therebetween. The slot electrode 55 and the reflective conductive plate 65 function as walls of the waveguide 301.

For the third insulating layer 52, for example, a silicon oxide ($SiO_x$) film, a silicon nitride ($SiN_x$) film, a silicon oxynitride ($SiO_xN_y$; x>y) film, a silicon nitride oxide ($SiN_xO_y$; x>y) film, or the like can be used as appropriate. Note that the third insulating layer 52 may be omitted. In FIG. 6B, illustration of the third insulating layer 52 is omitted.

The slot substrate 201 may further include an alignment mark (for example, a metal layer) and a base insulating layer covering the alignment mark on a side closer to the dielectric substrate 51 than the third insulating layer 52, similar to the TFT substrate 101.

In the transmission and/or reception region R1, a plurality of slots 57 are formed in the slot electrode 55. The slot 57 is an opening that opens through the slot electrode 55. In this example, one slot 57 is disposed in each antenna unit region U.

The fourth insulating layer 58 is formed on the slot electrode 55 and within the slot 57. The fourth insulating layer 58 here includes an opening 58a that at least reaches the third insulating layer 52 (or the dielectric substrate 51 in a case where the third insulating layer 52 is omitted) in the slot 57. The opening 58a may be omitted. The material of the fourth insulating layer 58 may be the same as the material of the third insulating layer 52. By covering the slot electrode 55 with the fourth insulating layer 58, the slot electrode 55 and the liquid crystal layer LC are not in direct contact with each other, such that the reliability can be enhanced. In a case where the slot electrode 55 is formed of a Cu layer, Cu may elute into the liquid crystal layer LC in some cases. In addition, in a case where the slot electrode 55 is formed of an Al layer by using a thin film deposition technique, the Al layer may include a void. The fourth insulating layer 58 can prevent the liquid crystal material from entering the void of the Al layer. Note that in a case where the slot electrode 55 is preparing by bonding an aluminum foil to the dielectric substrate 51 with an adhesive to form the Al layer and patterning the formed Al layer, the problem of voids can be avoided.

The slot electrode 55 includes a main layer such as a Cu layer or an Al layer. The slot electrode 55 may have a layered structure that includes the main layer as well as an upper layer and/or a lower layer disposed sandwiching the main layer therebetween. A thickness of the main layer may be configured in consideration of the skin effect depending on the material, and may be, for example, greater than or equal to 2 μm and less than or equal to 30 μm. The thickness of the main layer is typically greater than the thickness of the upper layer and the lower layer. For example, the main layer is a Cu layer, and the upper layer and the lower layer are Ti layers. By disposing the lower layer between the main layer and the third insulating layer 52, the adhesion between the slot electrode 55 and the third insulating layer 52 can be improved. In addition, by providing the upper layer, corrosion of the main layer (a Cu layer, for example) can be suppressed.

Since the reflective conductive plate 65 constitutes the wall of the waveguide 301, it is desirable that the reflective conductive plate 65 has a thickness that is three times or greater than the skin depth, and preferably five times or greater. An aluminum plate, a copper plate, or the like having a thickness of several millimeters manufactured by, for example, a cutting out process can be used as the reflective conductive plate 65.

As illustrated in FIG. 11, the terminal sections IT are provided in the non-transmission and/or reception region R2 of the slot substrate 201. The terminal section IT includes the slot electrode 55, the fourth insulating layer 58 covering the slot electrode 55, and an upper connection section 60. The fourth insulating layer 58 includes an opening 58*p* that at least reaches the slot electrode 55. The upper connection section 60 is in contact with the slot electrode 55 within the opening 58*p*.

As illustrated in FIG. 11, in the transfer section, the upper connection section 60 of the terminal section IT of the slot substrate 201 is electrically connected to a transfer terminal upper connection section 19*p* of the transfer terminal section PT in the TFT substrate 101. Here, the upper connection section 60 and the transfer terminal upper connection section 19*p* are connected with a resin (e.g., sealing resin) 78 including conductive beads 71 interposed therebetween.

Each of the upper connection sections 60 and 19*p* is a transparent conductive layer such as an ITO film or an IZO film, and has a surface on which an oxide film may be formed. In a case where an oxide film is formed, the electrical connection between the transparent conductive layers cannot be ensured, and the contact resistance may increase. In contrast, in the present embodiment, since these transparent conductive layers are bonded with a resin including conductive beads (for example, Au beads) 71 therebetween, even in a case where a surface oxide film is formed, the conductive beads pierce (penetrate) the surface oxide film, allowing an increase in contact resistance to be suppressed. The conductive beads 71 may penetrate not only the surface oxide film but also penetrate the upper connection sections 60 and 19*p* which are the transparent conductive layers, and directly contact the lower connection section 15*p* and the slot electrode 55.

Note that the seal region Rs (seal portion 73) may also have the same structure as the transfer section described above. In other words, the transfer section described above may be disposed within the seal region Rs (seal portion 73).

Manufacturing Method of Slot Substrate 201

The slot substrate 201 can be manufactured by the following method, for example.

First, the third insulating layer 52 (having a thickness of 300 nm to 1500 nm, for example) is formed on the dielectric substrate 51 by CVD, for example. Here, as the third insulating layer 52, a $SiN_x$ film having a thickness of 500 nm, for example, is deposited.

A substrate such as a glass substrate or a resin substrate having a high transmittance to electromagnetic waves (the dielectric constant $\varepsilon_M$ and the dielectric loss tan $\delta_M$ are small) can be used as the dielectric substrate 51. The dielectric substrate 51 is preferably thin in order to suppress the attenuation of the electromagnetic waves. For example, after forming the constituent elements such as the slot electrode 55 on the front face of the glass substrate by a process to be described later, the glass substrate may be thinned from the rear side. This allows the thickness of the glass substrate to be reduced to 500 μm or less, for example.

Note that in a case where a resin substrate is used as the dielectric substrate, constituent elements such as TFTs may be formed directly on the resin substrate, or may be formed on the resin substrate by a transfer method. In a case of the transfer method, for example, a resin film (for example, a polyimide film) is formed on the glass substrate, and after the constituent elements are formed on the resin film by the process to be described later, the resin film on which the constituent elements are formed is separated from the glass substrate. Generally, the dielectric constant $\varepsilon_M$ and the dielectric loss tan $\delta_M$ of resin are smaller than those of glass. The thickness of the resin substrate is, for example, from 3 μm to 300 μm. Besides polyimide, for example, a liquid crystal polymer can also be used as the resin material.

Next, a metal film (Cu film or Al film, for example) is formed on the third insulating layer 52 by sputtering, for example, and is patterned to obtain the slot electrode 55 including the plurality of slots 57. As the metal film, a Cu film having a thickness of 1.5 nm to 6 nm may be used, for example. Here, as the metal film, a layered film (Cu/Ti) is formed by layering a Ti film (having a thickness of 20 nm, for example) and a Cu film (having a thickness of 3000 nm, for example) in this order.

After that, the fourth insulating film (having a thickness of 50 nm to 400 nm, for example) is formed on the slot electrode 55 and in the slot 57. Here, as the fourth insulating film, a silicon nitride ($Si_xN_y$) film having a thickness of 130 nm, for example, is deposited.

After that, the fourth insulating film is etched through a known photolithography process to obtain the fourth insulating layer 58. Specifically, in the non-transmission and/or reception region R2, an opening 58*p* that at least reaches the slot electrode 55 is formed in the fourth insulating layer 58.

After that, a transparent conductive film is formed on the fourth insulating layer 58 and within the opening 58*p* by, for example, sputtering, and is patterned to form the upper connection section 60 in contact with the slot electrode 55 within the opening 58*p*. In this way, the terminal section IT can be obtained. An indium tin oxide (ITO) film, an IZO film, a zinc oxide (ZnO) film or the like can be used as the transparent conductive film. The transparent conductive film may have a layered structure including a Ti film, and an ITO film, an IZO film, or a ZnO film in this order. Here, as the transparent conductive film, a layered film (ITO/Ti) is used which is formed by layering Ti (having a thickness of 50 nm, for example) and ITO (having a thickness of 70 nm, for example) in this order.

In this manner, the slot substrate 201 is manufactured.

After that, the columnar spacer PS is formed on the slot substrate 201. For example, a photosensitive resin film is formed on the fourth insulating layer 58 and the transparent conductive layer (the layer including the upper connection section 60) formed on the fourth insulating layer 58, and the photosensitive resin film is exposed and developed via a photomask having openings with a predetermined pattern, and thereby, the columnar spacer PS can be formed. The photosensitive resin may be negative-working or positive-working. Here, a photosensitive resin film having a thickness of 2.7 μm is used, for example.

Note that the columnar spacer PS may be formed on the TFT substrate 101. In this case, the columnar spacer PS may be formed by that the TFT substrate 101 is manufactured by the method described above, and thereafter, a photosensitive resin film is formed on the second insulating layer 17 and the upper conductive layer 19, and then exposed and developed.

After the columnar spacer PS is formed on at least one of the slot substrate 201 and the TFT substrate 101, the process for forming the seal portion 73*a* and the additional seal portion 76A, and bonding the slot substrate 201 and the TFT substrate 101, the process for forming the liquid crystal layer, and the like are performed, and thereby, the scanning antenna according to the embodiment of the disclosure can be obtained.

Material and Structure of TFT

In the embodiments of the disclosure, a TFT including a semiconductor layer 5 as an active layer is used as a switching element disposed in each pixel. The semiconductor layer 5 is not limited to an amorphous silicon layer, and may be a polysilicon layer or an oxide semiconductor layer.

In a case where an oxide semiconductor layer is used, the oxide semiconductor included in the oxide semiconductor layer may be an amorphous oxide semiconductor or a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer may have a layered structure including two or more layers. When the oxide semiconductor layer has the layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. The oxide semiconductor layer may include a plurality of amorphous oxide semiconductor layers. When the oxide semiconductor layer has a dual-layer structure including an upper layer and a lower layer, an energy gap of the oxide semiconductor included in the upper layer is preferably greater than an energy gap of the oxide semiconductor included in the lower layer. However, when a difference in the energy gap between these layers is relatively small, the energy gap of the oxide semiconductor in the lower layer may be greater than the energy gap of the oxide semiconductor in the upper layer.

Materials, structures, and film formation methods of an amorphous oxide semiconductor and the above-described crystalline oxide semiconductors, a configuration of an oxide semiconductor layer including a layered structure, and the like are described in, for example, JP 2014-007399 A. The entire contents of the disclosure of JP 2014-007399 A are incorporated herein by reference.

The oxide semiconductor layer may include, for example, at least one metal element selected from In, Ga, and Zn. In the present embodiment, the oxide semiconductor layer includes, for example, an In—Ga—Zn—O based semiconductor (for example, an indium gallium zinc oxide). Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, or In:Ga:Zn=1:1:2, or the like. Such an oxide semiconductor layer can be formed of an oxide semiconductor film including an In—Ga—Zn—O based semiconductor.

The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein by reference. Since a TFT including an In—Ga—Zn—O based semiconductor layer has high mobility (more than 20 times in comparison with a-Si TFTs) and low leakage current (less than 1/100th in comparison with a-Si TFTs), such a TFT can suitably be used as a driving TFT (for example, a TFT included in a drive circuit provided in the non-transmission and/or reception region) and a TFT provided in each antenna unit region.

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, and the like.

In the example described above, the TFT 10 is a channel etched type TFT having a bottom gate structure. The "channel etched type TFT" does not include an etch stop layer formed on the channel region, and a lower face of an end portion of each of the source and drain electrodes, which is closer to the channel, is provided so as to be in contact with an upper face of the semiconductor layer. The channel etched type TFT is formed by, for example, forming a conductive film for a source/drain electrode on a semiconductor layer and performing source/drain separation. In the source/drain separation process, a surface portion of the channel region may be etched.

Note that the TFT included in each antenna unit may be an etch stop type TFT in which an etch stop layer is formed on the channel region. In the etch stop type TFT, the lower face of an end portion of each of the source and drain electrodes, which is closer to the channel, is located, for example, on the etch stop layer. The etch stop type TFT is formed as follows; after forming an etch stop layer covering the portion that will become the channel region in a semiconductor layer, for example, a conductive film for the source and drain electrodes is formed on the semiconductor layer and the etch stop layer, and source/drain separation is performed.

In addition, although the TFT 10 has a top contact structure in which the source and drain electrodes are in contact with the upper face of the semiconductor layer, the source and drain electrodes may be disposed to be in contact with the lower face of the semiconductor layer (a bottom contact structure). Furthermore, the TFT may have a bottom gate structure having a gate electrode on the dielectric substrate side of the semiconductor layer, or a top gate structure having a gate electrode above the semiconductor layer.

Example of Antenna Unit Array and Connection of Gate Bus Line and Source Bus Line In the scanning antenna according to the embodiments of the disclosure, the antenna units are arrayed concentrically, for example.

For example, in a case where the antenna units are arrayed in m concentric circles, one gate bus line is provided for each circle, for example, such that a total of m gate bus lines is provided. For example, assuming that the outer diameter of the transmission and/or reception region R1 is 800 mm, m is 200, for example. Assuming that the innermost gate bus line is the first one, n (30, for example) antenna units are connected to the first gate bus line and nx (620, for example) antenna units are connected to the m-th gate bus line.

In such an array, the number of antenna units connected to each gate bus line is different. In addition, although m antenna units are connected to n source bus lines that are also connected to the antenna units constituting the innermost circle, among nx source bus lines connected to nx antenna units that constitute the outermost circle, the number of antenna units connected to other source bus lines is less than m.

In this way, the array of antenna units in the scanning antenna is different from the array of pixels (dots) in the LCD panel, and the number of connected antenna units differs depending on the gate bus line and/or source bus line. Accordingly, in a case where the capacitances (liquid crystal capacitances+auxiliary capacities) of all the antenna units are set to be the same, depending on the gate bus line and/or the source bus line, the electrical loads of the antenna units connected thereto differ. In such a case, there is a problem where variations occur in the writing of the voltage to the antenna unit.

Accordingly, to prevent this, the capacitance value of the auxiliary capacity is preferably adjusted, or the number of antenna units connected to the gate bus line and/or the source bus line is preferably adjusted, for example, to make the electrical loads of the antenna units connected to the gate bus lines and the source bus lines substantially the same.

The scanning antenna according to the embodiments of the disclosure is housed in a plastic housing as necessary, for example. It is preferable to use a material having a small dielectric constant $\varepsilon_M$ that does not affect microwave transmission and/or reception in the housing. In addition, the housing may include a through-hole provided in a portion thereof corresponding to the transmission and/or reception region R1. Furthermore, the housing may include a light blocking structure such that the liquid crystal material is not exposed to light. The light blocking structure is, for example, provided so as to block light that propagates through the dielectric substrate 1 and/or 51 from the side surface of the dielectric substrate 1 of the TFT substrate 101 and/or the side surface of the dielectric substrate 51 of the slot substrate 201 and is incident upon the liquid crystal layer. A liquid crystal material having a large dielectric anisotropy $\Delta\varepsilon_M$ may be prone to photodegradation, and as such it is preferable to shield not only ultraviolet rays but also short-wavelength blue light from among visible light. By using a light-blocking tape such as a black adhesive tape, for example, the light blocking structure can be easily formed in necessary locations.

INDUSTRIAL APPLICABILITY

The embodiments according to the disclosure are applied to scanning antennas for satellite communication or satellite broadcasting that are mounted on mobile bodies (ships, aircraft, and automobiles, for example) or to the manufacture thereof.

REFERENCE SIGNS LIST

1 Dielectric substrate
2 Base insulating layer
3 Gate metal layer
3C Lower auxiliary capacitance electrode
3G Gate electrode
3g Lower connection section
4 Gate insulating layer
4g Opening
5 Semiconductor layer
6D Drain contact layer
6S Source contact layer
7 Source metal layer
7C Upper auxiliary capacitance electrode
7D Drain electrode
7S Source electrode
7s Lower connection section
11 First insulating layer
11g, 11p Opening
15 Patch electrode
15h Protruding portion
15l Patch metal layer
15p Lower connection section
17 Second insulating layer
17g, 17p Opening
19 Upper conductive layer
19g, 19p, 19s Upper connection section
21 Alignment mark
51 Dielectric substrate
52 Third insulating layer
54 Dielectric layer (air layer)
55 Slot electrode
57 Slot
58 Fourth insulating layer
58a, 58p Opening
60 Upper connection section
65 Reflective conductive plate
70 Power feed device
71 Conductive beads
72 Power feed pin
73, 73a Seal portion
74a Injection port
75a Main seal portion
76A, 76B, 76C, 76D, 76E, 76F, 76G Additional seal portion (wall structure)
79a First main side face
79b Second main side face
100Aa, 100Ba, 100Ca Liquid crystal panel
101, 101a TFT substrate
201, 201a Slot substrate
301 Waveguide
1000, 1001 Scanning antenna
CH_g, CH_p, CH_s Contact hole
GD Gate driver
GL Gate bus line
GT Gate terminal section
IT Terminal section
LC Liquid crystal layer
PS Columnar spacer
PT Transfer terminal section
R1 Transmission and/or reception region
R2 Non-transmission and/or reception region
R2a First non-transmission and/or reception region
R2b Second non-transmission and/or reception region
Rs Seal region
SD Source driver
SL Source bus line
ST Source terminal section
U Antenna unit, Antenna unit region

The invention claimed is:

1. A scanning antenna with a transmission and/or reception region including a plurality of antenna units and a non-transmission and/or reception region other than the transmission and/or reception region, the scanning antenna comprising:
   a thin film transistor (TFT) substrate including a first dielectric substrate and, a plurality of TFTs, a plurality of gate bus lines, a plurality of source bus lines, and a plurality of patch electrodes, supported by the first dielectric substrate;
   a slot substrate including a second dielectric substrate and a slot electrode formed on a first main surface of the second dielectric substrate, the slot electrode including a plurality of slots arranged corresponding to the plurality of patch electrodes;
   a liquid crystal layer provided between the TFT substrate and the slot substrate;
   a seal portion surrounding the liquid crystal layer;
   a wall structure disposed in a region surrounded by the seal portion in the non-transmission and/or reception region;
   a reflective conductive plate disposed opposing a second main surface of the second dielectric substrate on a side opposite to the first main surface with a dielectric layer interposed between the reflective conductive plate and the second main surface;
   a first spacer structure disposed in the transmission and/or reception region, and defining a first gap between the first dielectric substrate and the second dielectric substrate in the transmission and/or reception region; and
   a second spacer structure disposed in the wall structure, and defining a second gap between the first dielectric substrate and the second dielectric substrate in the non-transmission and/or reception region, the second gap being wider than the first gap,
   wherein the wall structure includes a first main side face and a second main side face that intersect a surface of the first dielectric substrate, and at least one of the first main side face and the second main side face includes a plurality of recessed portions and/or a plurality of protruding portions when viewed from a normal direction of the first dielectric substrate.

2. The scanning antenna according to claim 1, wherein a pitch of the plurality of recessed portions and/or the plurality of protruding portions is from 2 mm to 100 mm when viewed from the normal direction of the first dielectric substrate.

3. The scanning antenna according to claim 1, wherein the seal portion includes a first granular spacer defining a thickness of the liquid crystal layer in the transmission and/or reception region, and
   the second spacer structure includes a second granular spacer having a particle diameter greater than a particle diameter of the first granular spacer.

4. A method for manufacturing a scanning antenna, the scanning antenna being according to claim 1, the method comprising:
   a step for forming the liquid crystal layer, the step for forming the liquid crystal layer includes a step for supplying liquid crystal material to generate a vacuum bubble within a region between the TFT substrate and the slot substrate, and surrounded by the seal portion.

5. The method for manufacturing the scanning antenna according to claim 4,
   wherein the step for forming the liquid crystal layer further includes a step for increasing a temperature of the liquid crystal layer to 80° C. or more after the step for supplying the liquid crystal material.

6. The method for manufacturing the scanning antenna according to claim 4,
   wherein the liquid crystal layer is formed using a vacuum injection method.

7. The method for manufacturing the scanning antenna according to claim 4,
   wherein the liquid crystal layer is formed using one drop filling, and
   the step for forming the liquid crystal layer includes a step for dropping an amount of liquid crystal material smaller than a volume of the region between the TFT substrate and the slot substrate, and surrounded by the seal portion.

* * * * *